[19] United States Patent
Karnowski et al.

[11] 4,342,963
[45] Aug. 3, 1982

[54] STORAGE BATTERY ELECTROLYTE TEMPERATURE MEASURING APPARATUS

[75] Inventors: Gary A. Karnowski, Milwaukee; Durvasula V. Sriramamurty, Glendale, both of Wis.

[73] Assignee: Globe-Union Inc., Milwaukee, Wis.

[21] Appl. No.: 126,172

[22] Filed: Feb. 29, 1980

[51] Int. Cl.³ ............................................. G01N 27/42
[52] U.S. Cl. ..................................... 324/431; 324/427
[58] Field of Search .................. 320/48; 324/427, 430, 324/431

[56] References Cited

U.S. PATENT DOCUMENTS 2,979,650  4/1961  Godshalk ............................ 324/431
4,028,616  6/1977  Stevens .............................. 324/431
4,193,025  3/1980  Frailing ............................. 324/427

Primary Examiner—Michael J. Tokar
Attorney, Agent, or Firm—Neuman, Williams, Anderson & Olson

[57] ABSTRACT

There are described apparatus for measuring the temperature of the electrolyte material in a lead-acid storage battery without physical access to that material. The apparatus is included as a part of a larger apparatus for analyzing the condition of the battery and its suitability for further use in automobile lighting, starting, and ignition applications. The apparatus measures the temperature of a brass connector placed in thermal contact with the battery negative post at a time immediately prior to connecting the analyzing apparatus to the battery and at a predetermined time thereafter and produces an output signal indicative of the electrolyte temperature in response to those measurements.

13 Claims, 13 Drawing Figures

FIG. 6a
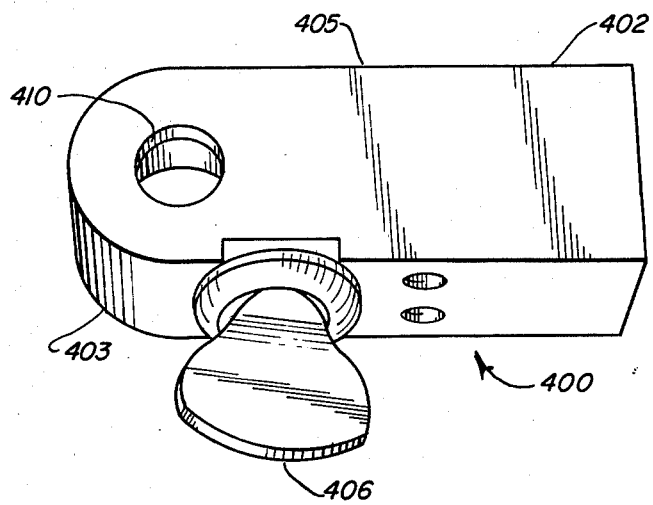
FIG. 6b
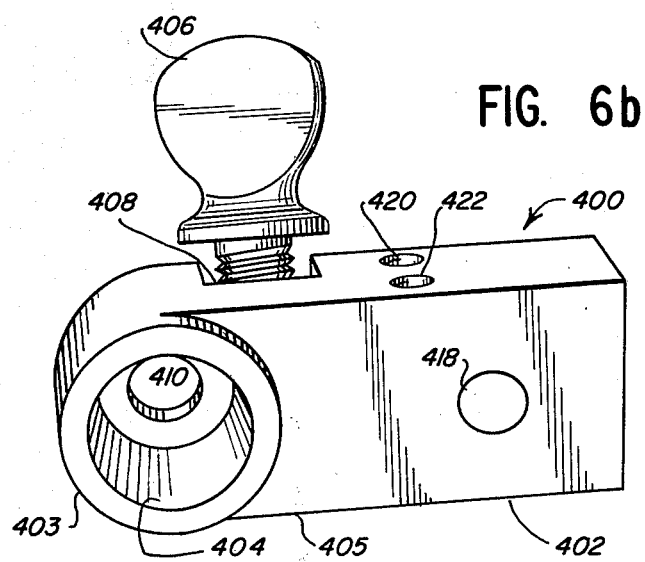
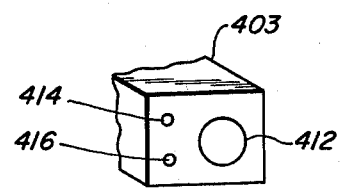
FIG. 6c

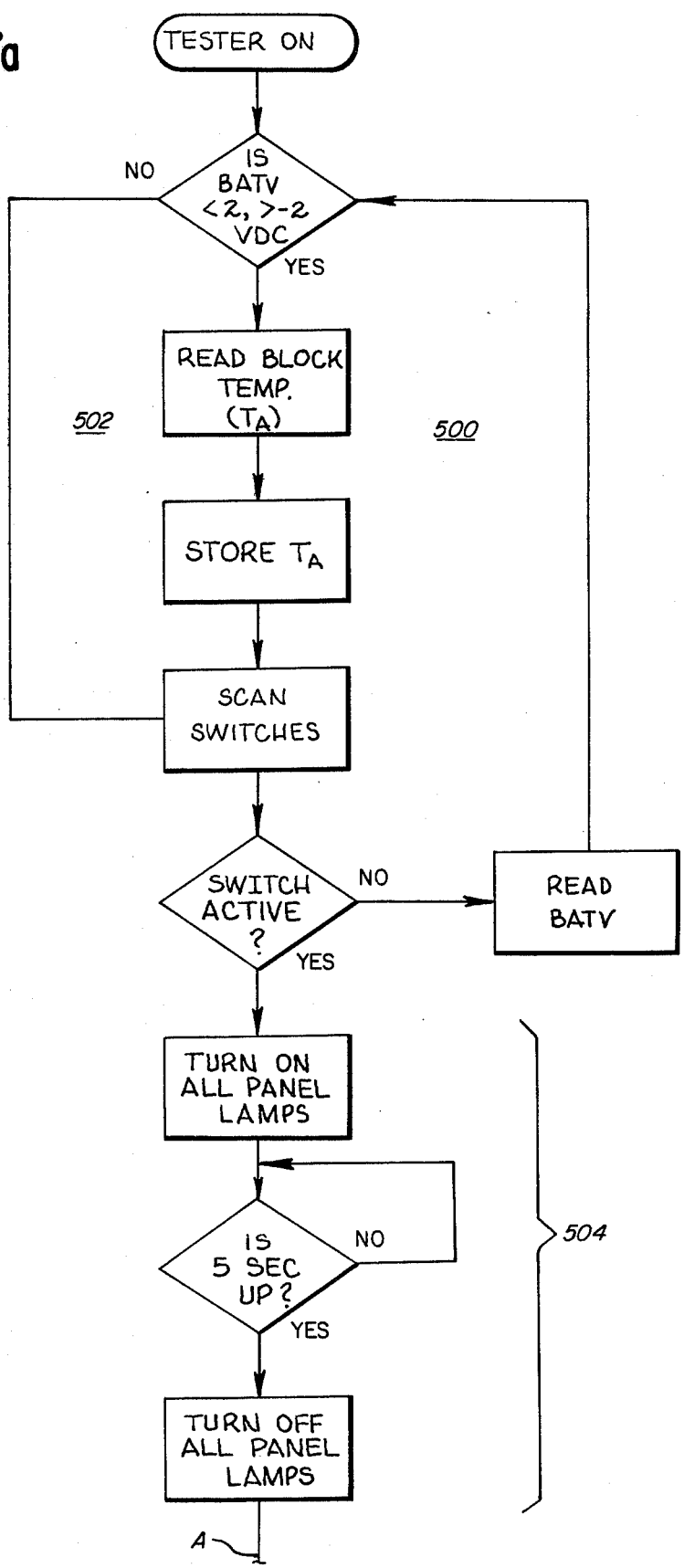

STORAGE BATTERY ELECTROLYTE TEMPERATURE MEASURING APPARATUS

BACKGROUND OF THE INVENTION

This invention relates to apparatus for measuring the electrolyte temperature in a storage battery and more particularly relates to such apparatus particularly useful where physical access to the battery electrolyte is either not possible or not convenient without destruction of all or a portion of the battery and further contemplates the provision of automatic battery analyzing apparatus including such temperature measuring apparatus.

There has in the past been much effort at developing apparatus for determining the condition of storage batteries such as the lead-acid type normally used for starting, lighting, and ignition in the automotive field and, in particular, for determining the acceptability of such batteries for use under adverse conditions such as the starting of an automobile engine at low temperatures. It has been known in the past that in making such a determination the temperature of the battery at the time any tests are being made thereon must be taken into account since the performance of a lead-acid storage battery varies widely with variations in temperature. The advent of automotive batteries with either no means for access to the battery electrolyte or with such means suitable for only infrequent use has created a need for apparatus for determining the acceptability of a battery which apparatus does not require any access to the interior of the battery or any physical contact with the battery electrolyte and which is also capable of compensating for the temperature of the battery under test. The testing of automotive batteries is further complicated by the conditions under which they are commonly tested. Since the performance of automotive batteries is most critical during cold weather, such batteries are most often tested during cold weather when, for example, the battery itself may be at a very low temperature, often many degrees below freezing, because it has been outside for a prolonged period of time. However, the actual testing of the battery may be performed in a relatively warm environment when a battery already in service is removed from the automobile and taken inside for testing or the automobile is driven into a service bay. In such instances, the battery electrolyte normally will be at approximately the ambient outside temperature, but the portions of the battery conveniently accessable for measuring temperature, such as the battery connector or post, will not be at the battery electrolyte temperature but rather at some temperatures intermediate the electrolyte temperature and the ambient inside temperature. It is important that the battery temperature be determined sufficiently accurately that the results of the battery test are not adversely effected; it is particularly important that the temperature be determined accurately in the low temperature range because of the relative ineffeciency of battery operation at low temperatures and the sensitivity of battery efficiency to relatively small temperature changes.

Apparatus for automatically analyzing the condition of an automotive battery including circuitry attempting to account for the battery temperature are known in the prior art. Such apparatus and various of the desideratum of such apparatus are disclosed in the U.S. patent application of C. E. Frailing and T. J. Dougherty, Ser. No. 863,925, filed Dec. 23, 1977 now Pat. No. 4,193,025, entitled "Automotive Battery Analyzer" and assigned to the assignee of this application, now U.S. Pat. No. 4,193,025 which issued on Mar. 11, 1980. The disclosure of that application is hereby incorporated by reference. The apparatus shown therein took temperature measurements of the battery's negative terminal or post at two times, the time at which the leads of the apparatus were connected to the battery terminals and the time five seconds later. On the basis of empirical observation, it was estimated that the difference between the two measured temperatures was approximately one-fourth of the difference between the initial measured temperature and the actual battery temperature, and this approximation was used to calculate an estimated battery temperature. However, further work with automatic battery analyzers has shown that increased accuracy over that provided by the prior approach is desirable.

In the design of temperature measuring apparatus for use with automotive battery analyzers, a number of criteria must also be considered in addition to the accuracy of the resultant measurement. It is necessary that the apparatus not be so complex that relatively unskilled personnel would have difficulty in using it. It is desirable that the apparatus be useful with a wide variety of different types of battery designs. Specifically, it is desirable that the apparatus be useful with batteries of the traditional type having the connector posts located on the top surface of the battery as well as with batteries of the more recently introduced type having posts located on a side surface of the battery. It is necessary that the apparatus be useful when the battery is either in an automobile in its normal service location or removed from the automobile. It is also desirable that the apparatus be of such a physical construction that it can be used in a wide variety of automobiles which, for example, may have battery covers, battery shields or cases, structural members of the automobile, or other components of the automobile located in different physical relationships to, and closely adjacent, the battery. Finally, it is necessary that the temperature measuring apparatus not be such that either the temperature measurement itself or the period required for the associated battery analyzer circuit to test a battery be undersirably long.

SUMMARY OF THE INVENTION

Thus, it is an object of this invention to provide apparatus for measuring the temperature of a storage battery which is particularly useful for use with battery analyzing apparatus and which has greater accuracy than such apparatus heretofore available.

It is an object of this invention to provide apparatus for measuring the temperature of the electrolyte of a storage battery without physical contact with the electrolyte and without otherwise penetrating into the interior of the battery.

It is an object of this invention to provide apparatus for accurately measuring the electrolyte temperature of a storage battery which may easily be used by relatively unskilled persons.

It is an object of this invention to provide apparatus for accurately measuring the electrolyte temperature of automobile storage batteries which may be used with a large variety of different types of batteries.

It is an object of this invention to provide apparatus for accurately measuring the electrolyte temperature of automobile storage batteries useful with batteries located in a wide variety of types and designs of automobiles.

It is an object of this invention to provide apparatus for accurately measuring the electrolyte temperature of automobile storage batteries for use with associated battery analyzing apparatus and being such that neither the time required to make the temperature measurement nor the time required to analyze the battery is excessively long.

It is an object of the invention to provide automatic battery temperature measuring apparatus which meet the aforementioned objects and are further characterized by simplicity of design, ease of operation, and economy of construction.

Further and additional objects of this invention will be apparent from this description, the drawing, and the appended claims.

DESCRIPTION OF THE DRAWING

FIGS. 6a–6c show the brass connector of the apparatus of FIG. 3 for connection to the negative terminal of the battery under test; and FIGS. 7a–7e are a flow diagram of the apparatus of FIG. 3.

DESCRIPTION OF THE PREFERRED EMBODIMENT

Figure 1:
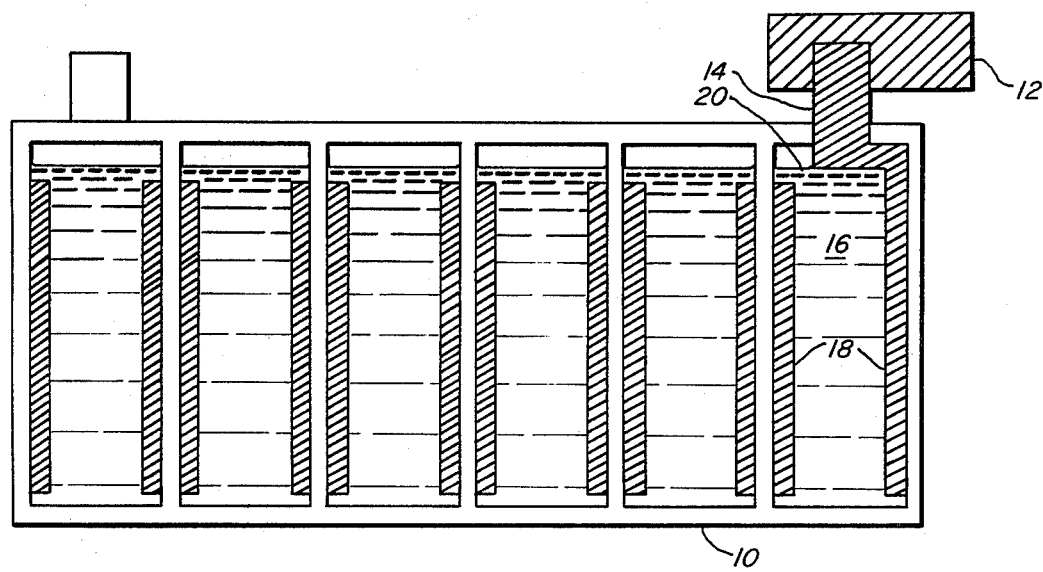
FIG. 1 is a diagramatic view of the interior of a lead-acid storage battery useful for explaining the operation of the preferred embodiment of this invention.
Figure 2:
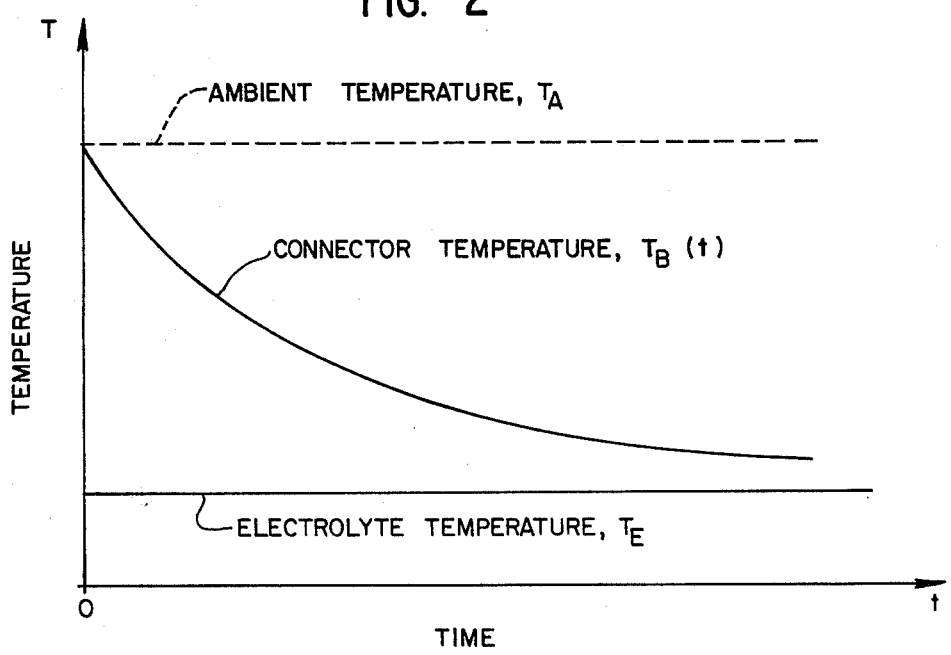
FIG. 2 is a graph useful for explaining the operation of the preferred embodiment of this invention.

FIG. 1 is a diagramatic view for use in explaining the operation of an embodiment of this invention and shows in schematic form a cross section of a multicell storage battery 10 of the lead-acid type normally used for starting, lighting, and ignition in automotive applications. Each cell includes two electrodes and is filled with electrolyte, one electrode from each of the two end cells extending through the battery case to form a post or terminal; the intercell connections are omitted from FIG. 1. A brass connector 12 is provided by the apparatus of this invention and is placed over the end of and in thermal contact with the negative battery post 14. For the purposes of thermal analysis, the system including the connector 12 situated in the ambient air, the battery post 14 and the electrode to which it is attached extending and the electrolyte 16 within that cell may be isolated for consideration. The mass and thermal capacity of the electrolyte are sufficiently large and the electrolyte is sufficiently insulated from the effects of the ambient air by the battery case that the electrolyte temperature may be considered to be essentially constant at least over relatively short time periods such as a few minutes. The temperature of the battery electrolyte at the surface of the battery electrodes heavily influences the rate of the chemical reactions that occur in the battery and, thus, the battery performance. It is common in the testing of automobile storage batteries that the battery is brought from a relatively cold outside environment to a relatively warm inside environment to test the condition of the battery and the apparatus used to perform the test is already at the inside ambient temperature. In such situations when the relatively warm connector 12 is placed upon and in thermal contact with the negative battery post, there is a relatively rapid heat flow from the connector to the negative battery post lowering the temperature of the connector and raising the temperature of the post. The result is that the temperature of the connector falls from the inside ambient temperature in a manner such as is shown in FIG. 2 wherein the relative values of the electrolyte, connector and ambient temperatures are shown as a function of the time following attachment of the connector to the negative battery post. The variation in the connector temperature may be represented as follows:

$$T_B(t) = T_A e^{-t/\tau} + (1 - e^{-t/\tau})(K_1 T_A + K_2 T_E)$$

where $T_B(t)$ = the connector temperature
$T_A$ = the ambient temperature
$T_E$ = the electrolyte temperature
t = the time following attachment of the connector to the battery post
$\tau$ = the thermal time constant of the connector
$K_1$ and $K_2$ are constants and may be evaluated empirically from measured data. The thermal time constant of the connector, $\tau$, is related to the physical properties of the connector and is equal to the product of thermal resistance of the connector times its thermal capacitance. Thus:

$$\tau = R \times C$$

where
R = the thermal resistance of the connector
C = the thermal capacitance of the connector
The thermal resistance and thermal capacitance of the brass connector are further defined as follows:
R = b/KA
b = the thickness of the connector in feet
A = the surface area of the connector exposed to the ambient air in square feet
K = the thermal conductivity of the connector in B.T.U. per hour—square foot—Fahrenheit degree
C = MS
M = the mass of the connector in pounds
S = the specific heat of the connector in B.T.U. per pound—Fahrenheit degree
If the time period t is permitted to become sufficiently large, the value of the exponential terms in the equation above for $T_B(t)$ become sufficiently small that they may be neglected, so that the equation becomes:

$$T_B(t) = K_1 T_A + K_2 T_E$$

The electrolyte temperature may then be calculated as follows:

$$T_E = [T_B(t) - K_1 T_A]/K_2$$

Figure 3:
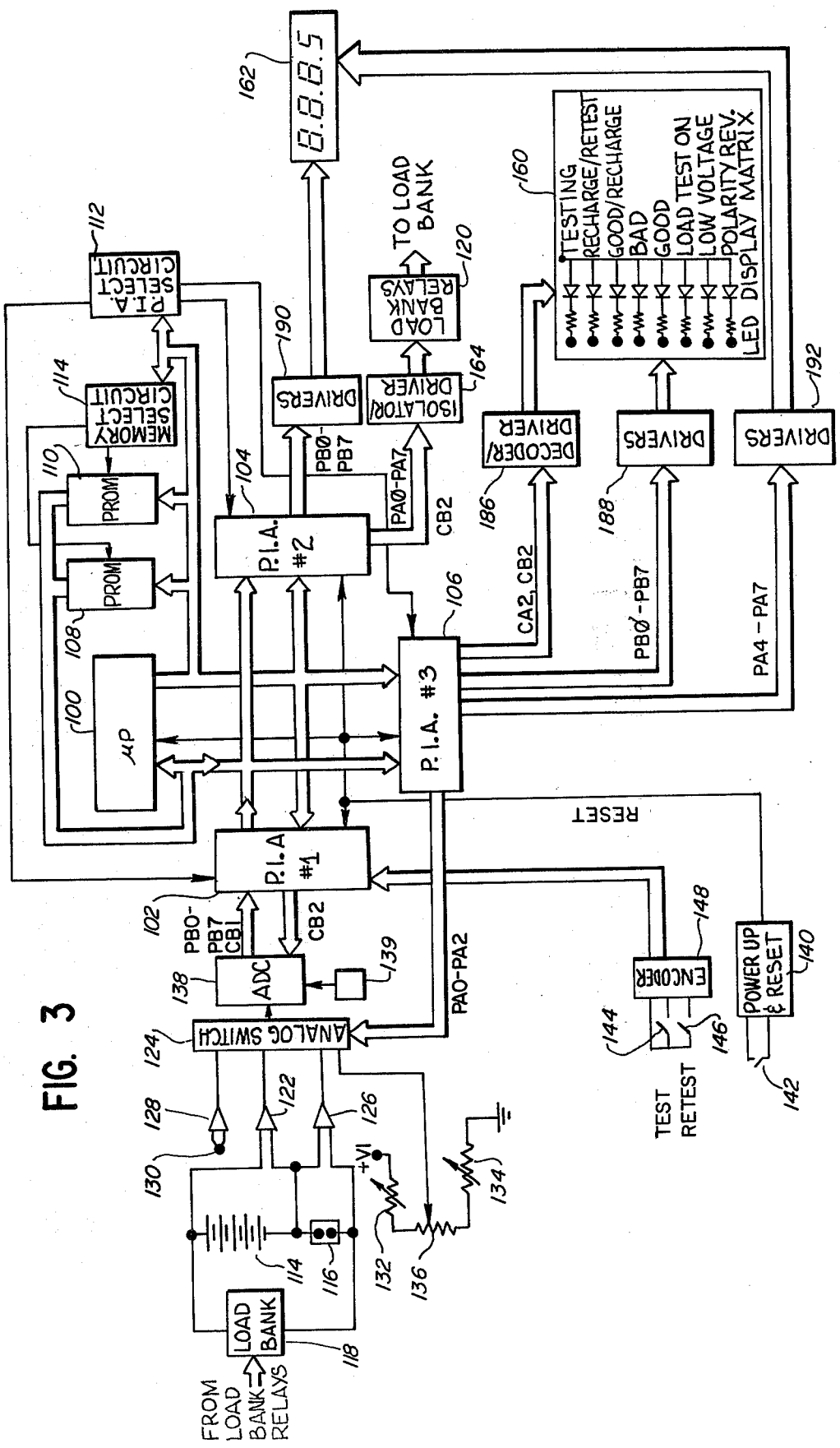
FIG. 3 is a diagram partly in block form and partly in a schematic form of an automatic battery analyzer including the preferred embodiment of this invention.
Figure 4:
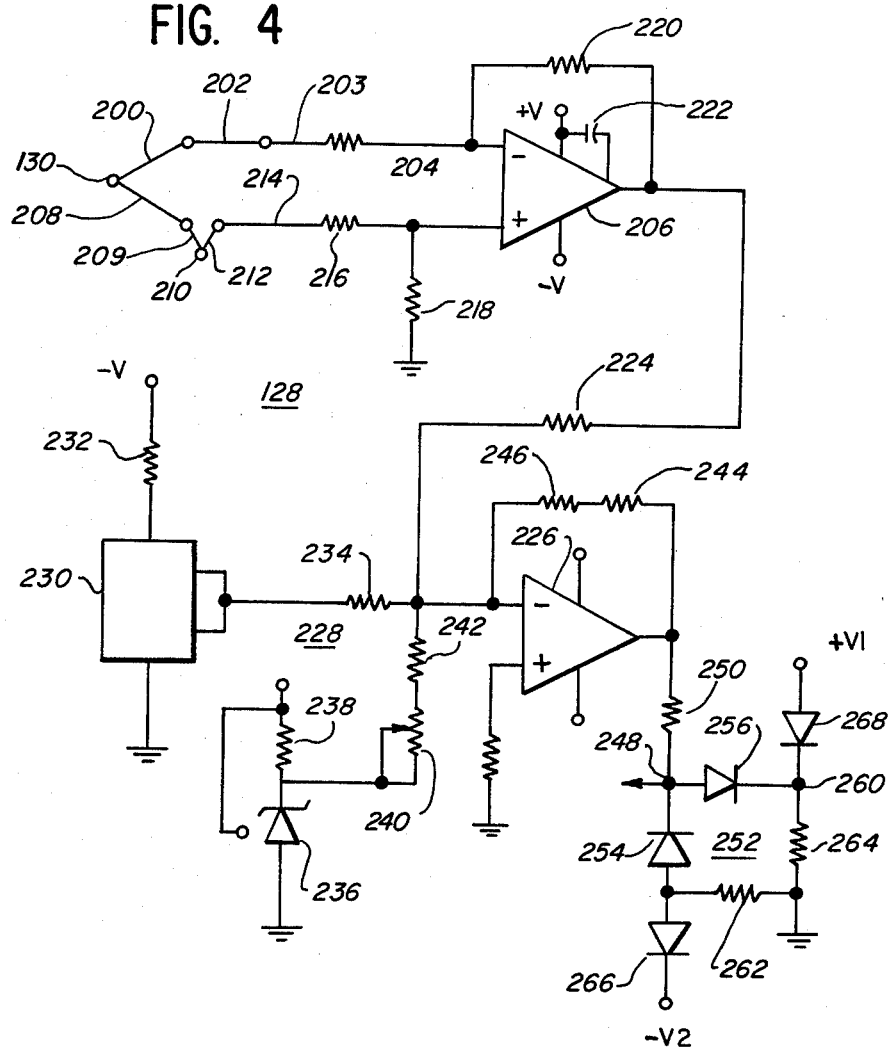
FIG. 4 is a schematic diagram of the temperature sensing circuit of the apparatus of FIG. 3.
Figure 5:
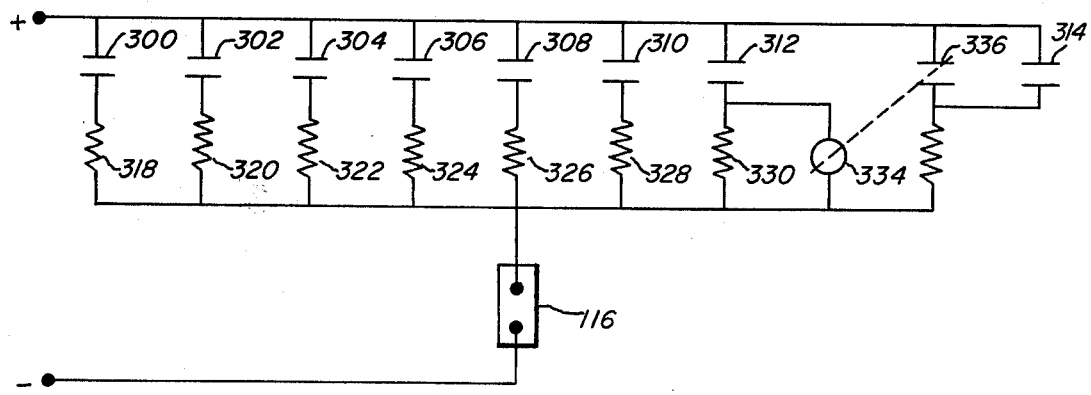
FIG. 5 is a schematic diagram of the load shank of the apparatus of FIG. 3.
Figure 7B:
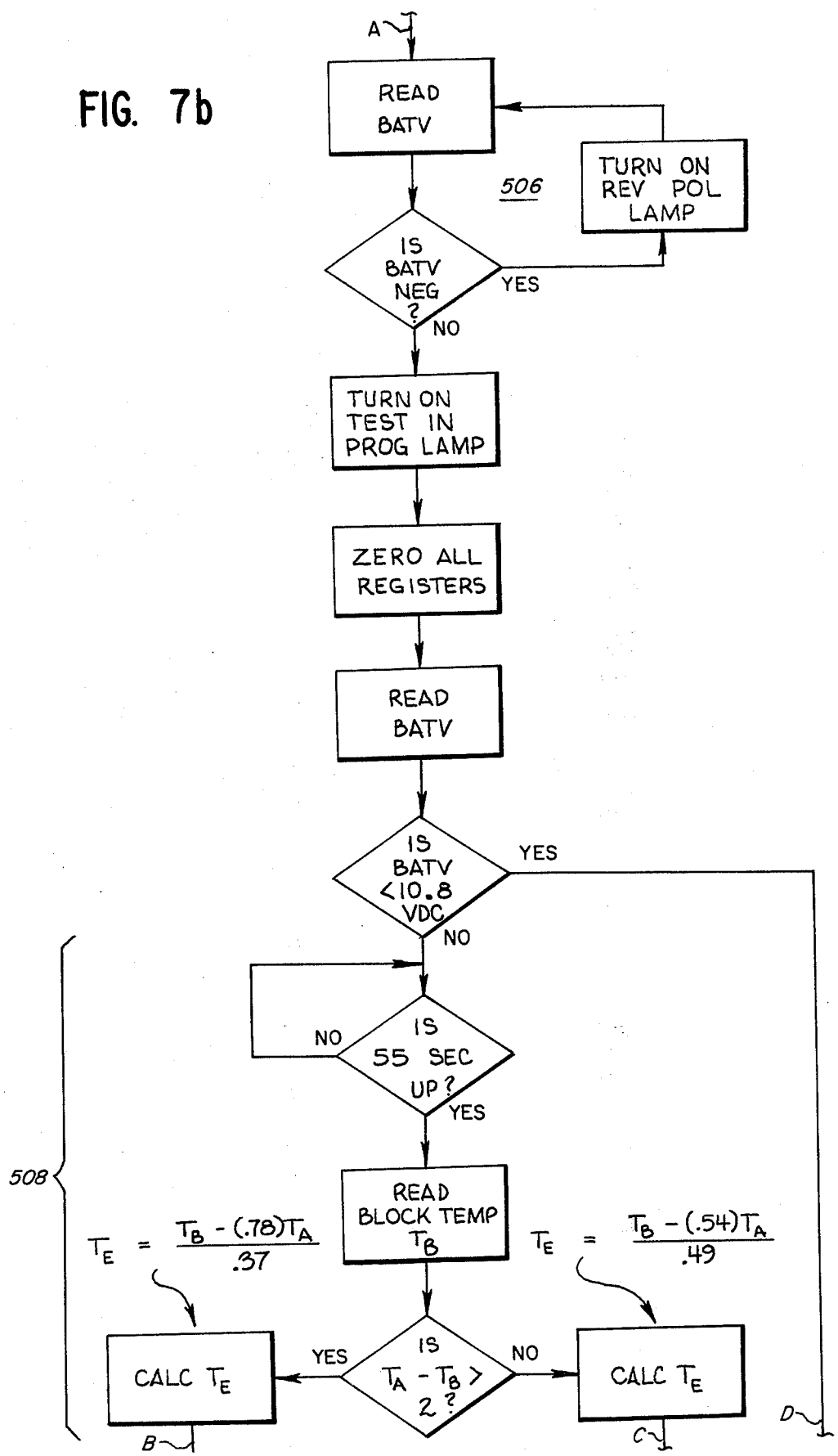
Figure 7C:
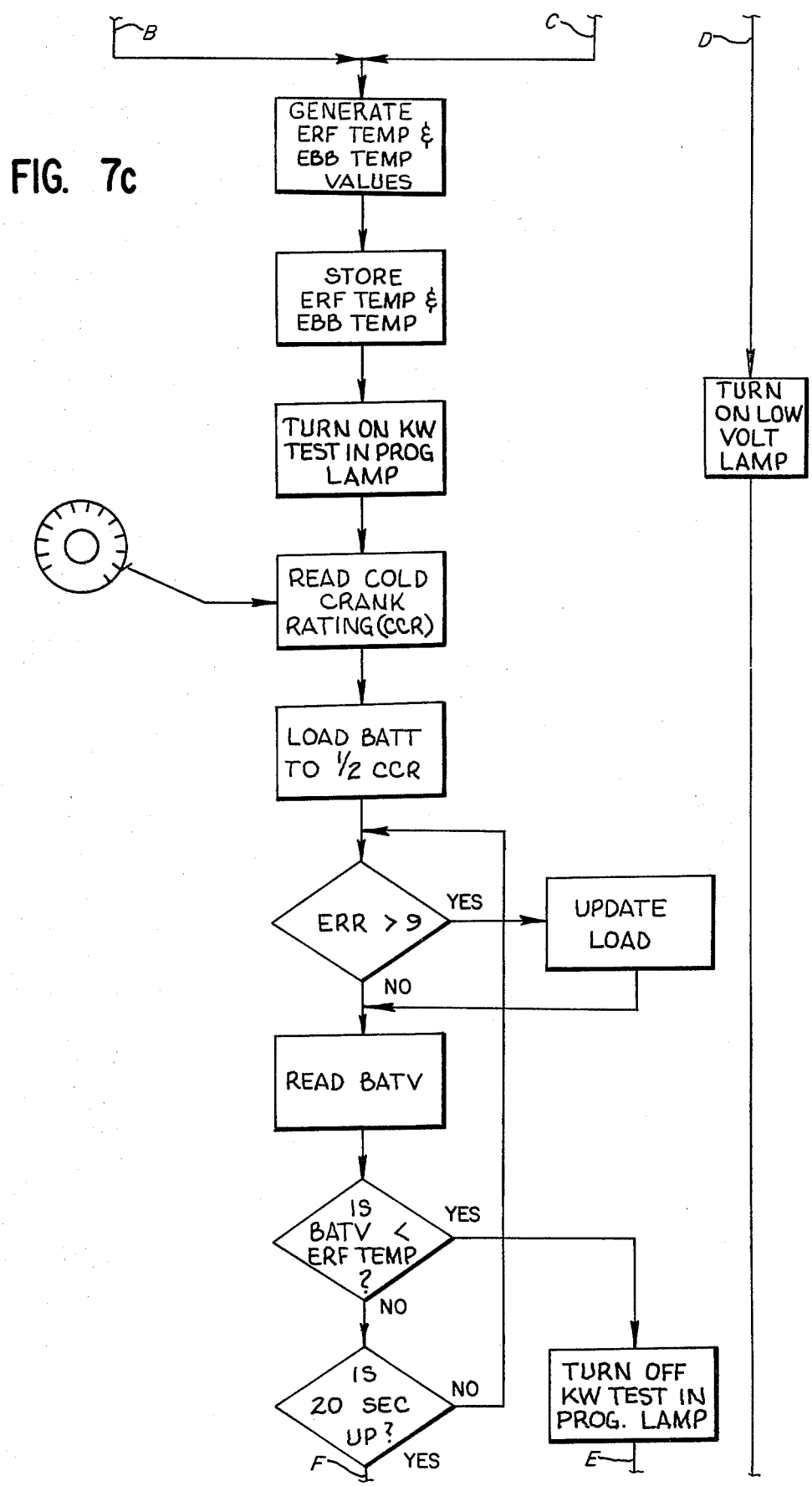
Figure 7D:
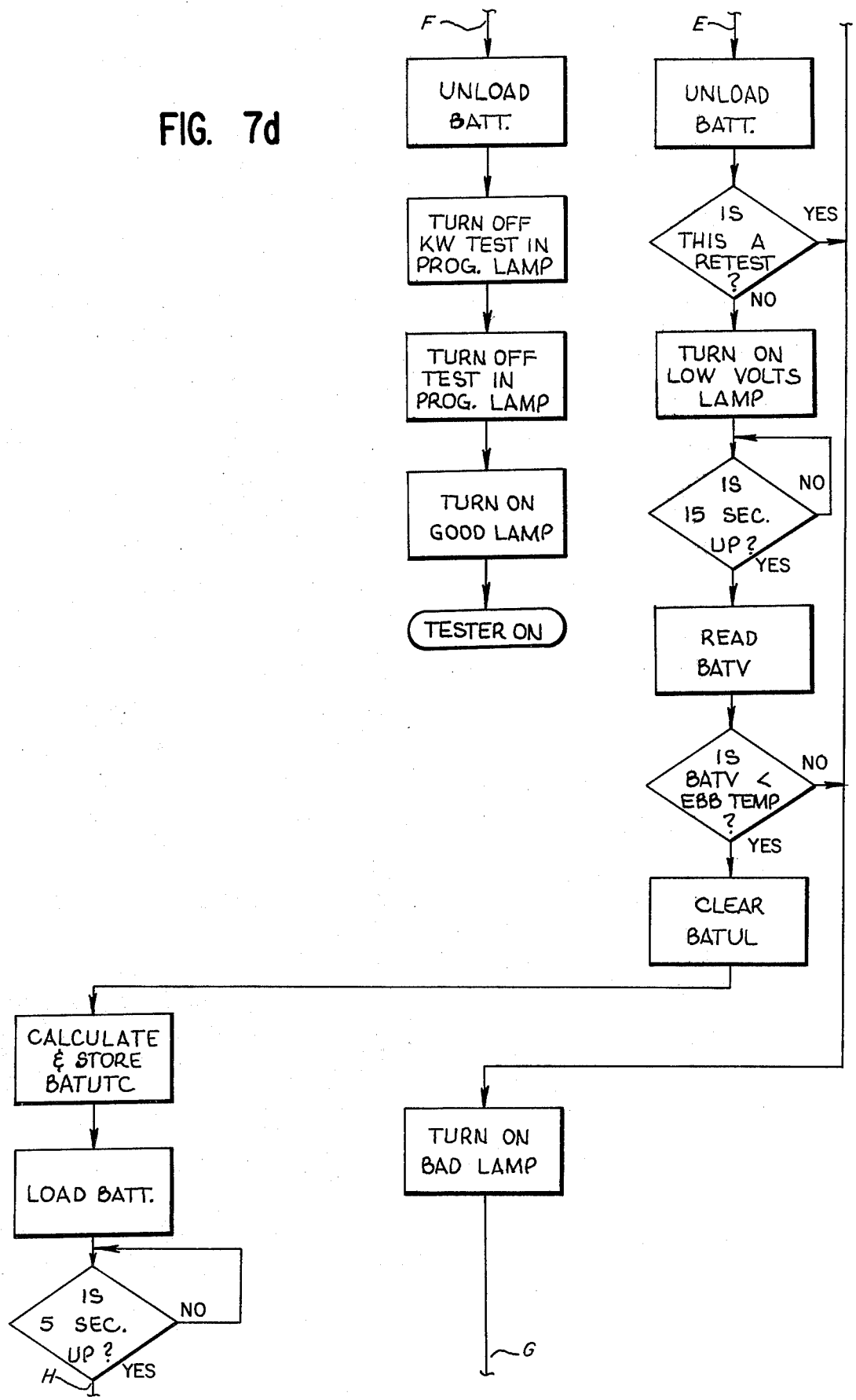
Figure 7E:
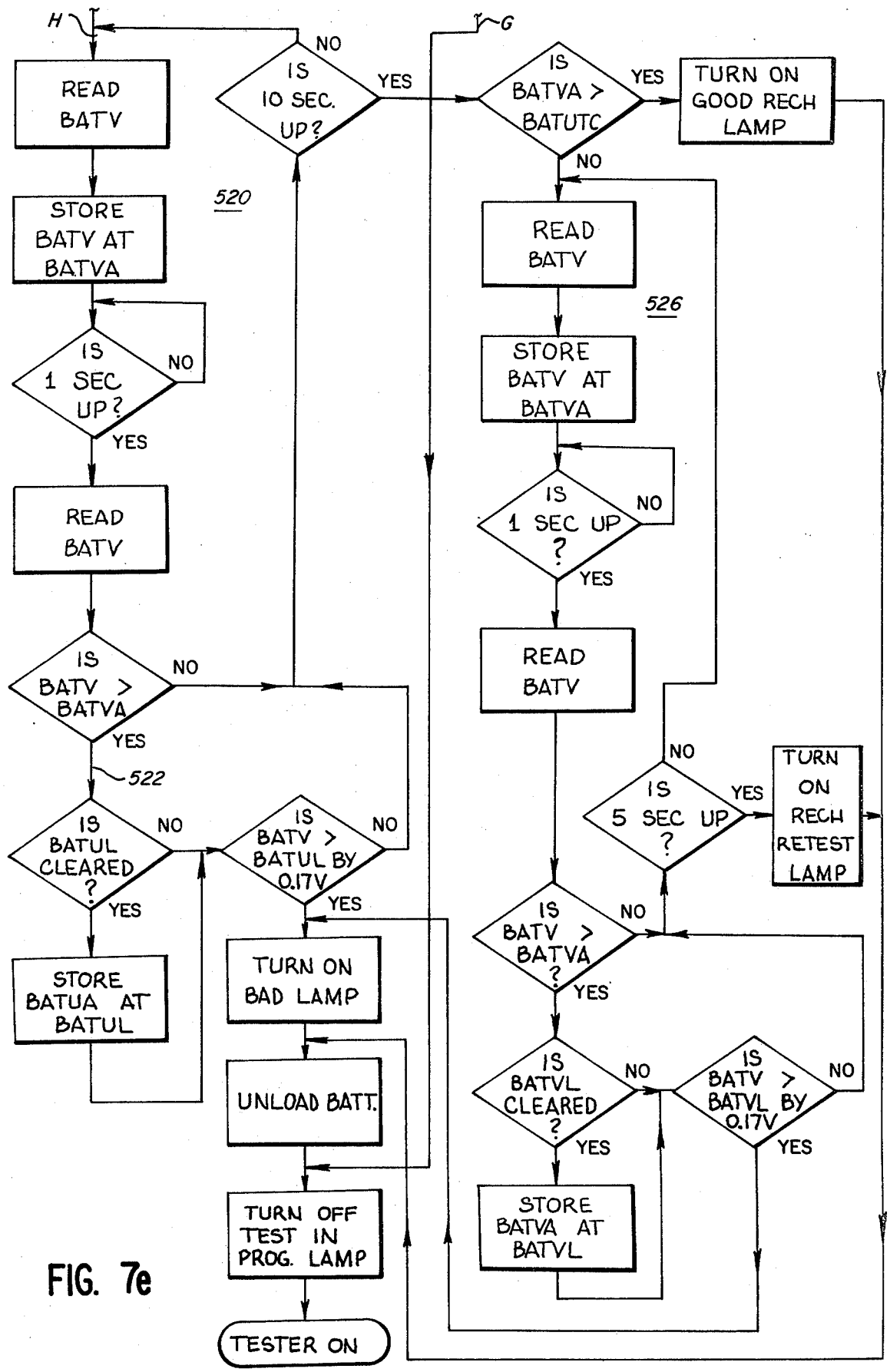

There is disclosed in the remaining figures of the drawing apparatus for measuring the electrolyte temperature of a lead-acid, automotive, starting, lighting and ignition battery making use of the above relationship. FIG. 3 is a block diagram of an automatic battery analyzer apparatus incorporating this invention and FIGS. 4 and 5 are schematic diagrams of particular circuits of the apparatus of FIG. 3. The apparatus of FIGS. 3-5 as actually constructed included provisions for analyzing portions of an automobile other than the battery. As those other provisions form no part of the present invention, they are not included in the following description to the extent feasible to avoid obscuring the present invention.

The automatic battery analyzer disclosed in FIG. 3 includes a microprocessor controller circuit 100, first, second, and third peripheral interface adapters (PIA's) 102, 104, and 106, respectively, for interfacing various input and output circuits to the microprocessor 100, and two programmable read only member circuits 108 and 110 for storage of the program used to control the operation of the microprocessor 100. The microprocessor 100 is an MC6802 and each of the PIA's is an MC6821 available from Motorola Semiconductor Products Inc., Austin, Texas; extensive information concerning the interconnections, use, and programming of these devices is available from Motorola Semiconductor Products Inc. Equivalent devices manufactured by others could be used and corresponding information concerning such devices is available from their respective manufacturers. The memories 108 and 110 are known by the industry standard designation 2716 and are each 8 bits by 2048 words; they are commercially available from a number of different manufacturers. Only the interconnections of the address bus (a sixteen line bus indicated as A0-A15 in FIG. 4), the data bus (an eight line bus indicated as D0-D7), and the reset line between the microprocessor, the PIA's, and the memories are indicated in FIG. 3 as the remainder of the necessary interconnections will be apparent to those familiar with the published information concerning these devices. Further detail is unnecessary and would unnecessarily complicate this description and perhaps obscure the invention. Simlarly, only the connections between the PIA input/output data lines and control lines and the various input and output devices are shown in FIG. 3.

Each of the PIA's 102, 104, and 106 includes A and B side eight bit, input/output data registers (PA0-PA7 and PB0-PB7), and A and B side two bit control registers (CA1, CA2, CB1, and CB2). Address lines A0 and A1 are connected to register select inputs of each of the three PIA's 102, 104, and 106, and a PIA select circuit 112 has inputs coupled to address lines A2, A3, A7, and A15 and outputs coupled to device select inputs of the three PIA's 102, 104, and 106 such that decoding of the address lines occurs placing the PIA registers at the addresses shown in Table 1 hereinafter. Address lines A0-A10 are connected to address inputs of the memories 108 and 110 and a memory select circuit 114 has inputs coupled to address lines A13, A14, and A15 and outputs coupled to device select inputs of memories 108 and 110 such that decoding of the address lines occurs placing the memories at hexadecimal addresses F000-FFFF.

The input information to the automatic battery analyzer of FIG. 3 is supplied through the first PIA 102. The battery under test 114 has its negative terminal coupled through connector 12 and through a low resistance current shunt 116 to one terminal of a variable resistance load bank 118. The positive terminal of battery 114 is coupled to a second terminal of load bank 118. The variable resistance load bank 118 is connected to an operated by a set of load bank relays 120 and is effective to place a variable resistance load across the battery under test. The magnitude of that load is determined by which one or ones of the load bank relays 120 are closed. A differential amplifier circuit 122 is provided having its inputs coupled across the battery under test 114 and its output coupled to one signal input of an analog switch 124. A differential amplifier circuit 126 has its inputs coupled across the current shunt 116 and has its output coupled to another signal input of analog switch 124. The signals at the outputs of amplifier circuits 122 and 126 are responsive to the voltage across and the current through the battery under test, respectively, at any instant of time. A temperature sensing circuit 128 includes a thermocouple 130 physicially located in the connector 12 coupled to the negative terminal of the battery under test; the circuit 128 will also be described in further detail hereinafter. An output of circuit 128 is responsive to the temperature of thermocouple 130 and is coupled to a third signal input of analog switch 124. The series connection of two variable resistances 132 and 134 and a potentiometer 138 is connected between a positive supply source +V and circuit ground with the tap on potentiometer 136 being coupled to a fourth signal input of analog switch 124. Potentiometer 136 is calibrated so that the user may adjust it to a position corresponding to the cold cranking rating of the battery under test whereas variable resistors 132 and 134 are used for calibration. The analog switch 124 is effective to develop at an output a signal responsive to that present at a selected one of its signal inputs and has input select inputs coupled to data lines PA0-PA2 of the A side of the third PIA 106. The output of analog switch 124 is coupled to the input of a three and one-half digit analog-to-digital converter 138. The data lines PB4-PB7 of the first PIA 102 are coupled to the digit select lines of analog-to-digital converter 138, the outputs of analog-to-digital converter 138 are coupled to the data lines PB0-PB3 of the first PIA 102, and the data update terminal and the end of conversion terminal of the analog-to-digital converter 138 are coupled to the control line CB2 and CB1, respectively, of the first PIA 102. A voltage reference source 139 is also coupled to the analog-to-digital converter 138. Thus, signals representing separate digits of the battery current and voltage and connector temperature are applied to the microprocessor data bus by the first PIA 102 in response to the generation of proper signals by the first and third PIA's 102 and 106. Analog switch 124 and analog-to-digital converter 138 may comprise, respectively, MC14051 and MC14433 units available from Motorola Semiconductor Products, Inc. with appropriate associated circuitry.

A power up and reset circuit 140 is provided for resetting the microprocessor 100 and PIA's 102, 104, and 106 when power is initially applied to the battery analyzer. The circuit has an output providing a signal to the reset inputs of the microprocessor 100 and each of the PIA's 102, 104, and 106 of proper magnitude and duration to cause resetting of these units to their initial condition. A "Stop" switch 142 is coupled to the circuit 140 for manual actuation so that an operator may stop a test in progress by closing the switch and resetting the microprocessor and the PIA's. Two manually operated switches 144 and 146 labelled "Test" and "Retest" are coupled to a switch encoder circuit 148. Manual operation of these switches indicates either that the operator desires to perform an initial test on the battery or that he wishes to retest a battery previously tested for reasons which will be discussed subsequently. Encoder circuit 148 is effective to apply an appropriate code to data lines PA0-PA3 of first PIA 102 in response to the status of switches 144 and 146.

Three forms of output devices are driven by the second and third PIA's 104 and 106, the variable resistance load bank 118 previously described, a light emitting diode display matrix 160, and a three-and-one-half digit display 162. The data lines PA0-PA7 and control line CB2 of the second PIA 104 are each individually coupled through one of a set of optically coupled isolators and drivers 164 to a relay in a set of load bank relays 120 such that the signals on those lines are each operative to control the operation of one of the relays. The relays controlled by data lines PA0-PA6 determine the magnitude of a variable resistance load placed across the battery under test with each controlling the current flow through one of a set of seven resistances connected in parallel. A schematic drawing of the load bank 118 with the associated relay contacts of the load bank relays 120 as well as the shunt 116 is shown in FIG. 5. The positive terminal of the battery under test is coupled to one contact of each of eight normally open pairs of contacts 300, 302, 304, 306, 308, 310, 312, and 314. The other contacts of each of those pairs is connected to one terminal of a resistor 318, 320, 322, 324, 326, 328, 330, and 332, respectively, the other terminal of those resistors being connected together to the shunt 116. The relative magnitudes of the six resistors 318–328 are in binary increments with resistor 328 having the least resistance, and the magnitudes of the three resistors 328–332 are equal. A relay coil 334 is coupled across resistor 330 and operates a normally open contact pair 336 coupled in parallel with the contact pair 314. The relays 300–312 are operated in response to the signals on data lines PA0-PA6 of the second PIA 104, respectively, whereas relay 314 is operated in response to the signal on control line CB2 of that same PIA. Relays 300-312 and their associated resistors are effective to place a variable resistance load across the battery under test, but relay 314 is effective to place a fixed resistance load across the battery.

The light emitting diode matrix 160 includes 8 separate series combinations of a resistor and a light emitting diode, the light emitting diodes 170, 172, 174, 176, 178, 180, 182, and 184 being labelled to indicate "Testing" or test in progress, "Recharge/Retest", "Good/Recharge", "Bad", "Good", "Load Test On", "Low Voltage", and "Polarity Reversed", respectively. Control lines CA2 and CB2 of the third PIA 106 are coupled to a decoder/driver circuit 186 to enable one of the vertical matrix lines of the matrix 160, only one such vertical matrix line actually being shown in the apparatus of FIG. 3. Data lines PB0-PB7 of the third PIA 106 are individually coupled through one of a set of drivers 188 to the light emitting diode/resistor series combinations of the matrix 160 in order to appropriately select a particular one of the diodes for energization.

The digit display 162 would normally not be used with the battery analyzer of FIG. 3, but may be used when it is desired to know the value of the voltage appearing at the output of the analog switch 124 at any particular time. A manually operated switch, not shown, is coupled to data line PA3 of the third PIA 106 for coupling that line to circuit ground when no such display is desired and to a positive potential when such a display is desired. The data lines PB0-PB7 are individually coupled through one of a set of drivers 190 of PIA 106 to the segment and decimal point select lines of the display 162 and the data lines PA4-PA7 are individually coupled through one of a set of drivers 192 to the digit select lines of the display 162.

FIG. 4 is a detailed schematic diagram of the temperature sensing circuit 128 used to develop a signal responsive to the temperature of thermocouple 130. The thermocouple 130 is comprised of a copper/constantan junction. The copper side of that junction is coupled through copper lines 200, 202, and 203, and through a resistor 204 to the inverting input of a differential amplifier 206. The constantan side of that junction is coupled through constantan lines 208 and 209 to another copper/constantan junction 210 and then through copper lines 212 and 214 and through a resistor 216 to the non-inverting input of amplifier 206, that input also being coupled to ground through a resistor 218. Feedback is provided through a resistor 220 coupled from the output of differential amplifier 206 to its inverting input. Differential amplifier 206 is coupled to positive and negative supply voltages +V1 and −V1, respectively, and a capacitor 222 is coupled from the positive power supply for the differential amplifier to the frequency compensation input thereof. The output of differential amplifier 206 is coupled through a resistor 224 to the inverting input of another differential amplifier 226.

A temperature compensating network 228 is also coupled to the inverting input of differential amplifier 226. Network 228 includes a temperature transducer 230 having its power supply terminals coupled to circuit ground and through a resistor 232 to the negative supply voltage −V1. The output of the transducer is coupled through a resistor 234 to the inverting input of differential amplifier 226. The copper/constantan junction 210 is placed in physical contact with the temperature transducer 230 so that the transducer is responsive to the temperature of that junction. A reference diode with built-in heat source 236 (e.g., an LM 399Z) is included having its anode coupled to circuit ground, its supply input for the heat source coupled to the positive voltage supply +V1, and its cathode coupled to the positive supply +V1 through a resistor 238 and to the inverting input of amplifier 226 through the series combination of a variable resistor 240 and a fixed resistor 242.

The output of differential amplifier 226 is coupled both to the inverting input thereof through the series combination of two resistors 244 and 246 to provide feedback and to an output terminal point 248 through a resistor 250. The output terminal point 248 is coupled to one input of the analog switch 124. A protection circuit 252 is also coupled to output circuit point 248 to limit the magnitude of the potential at that circuit point and protect the input to analog switch 124 from excess potential. That network includes first and second diodes 254 and 256 having their cathode and anode terminals, respectively coupled to output circuit point 248 and their other terminals coupled to circuit points 258 and 260, respectively. Those latter two circuit points are each coupled to ground through resistor 262 and 264 with circuit point 258 being also coupled to the anode of a diode 266 having its cathode coupled to a second negative voltage supply −V2 of greater voltage (i.e., less negative) than the first negative voltage supply −V1 and circuit point 260 also being coupled to the cathode of a diode 268 having its anode coupled to a second positive voltage supply +V2 of lesser voltage than the first positive voltage supply +V1. The temperature sensing circuit 128 provides an output of approximately 20 millivolts per °F. The solid state temperature transducer 230 compensates for changes in temperature of the reference junction 210. The reference diode 236 and associated resistors provide a constant, temperature stable, offset voltage.

The thermocouple 130 is physically located within a connector 400 attached to the negative post of the battery under test. The connector 400 is disclosed in FIGS. 6a–6c. The connector includes a connector block 402 having a circular portion 403 and a shank portion 405. A receptacle opening 404 on one side of circular portion 403 extends partway through the connector block for receiving the negative post or terminal of the battery under test. Receptacle opening 404 may be tapered so that the connector block 402 may easily be fit snugly onto the negative post of the battery under test. A thumbscrew 406 is provided which screws into a threaded opening 408 in the connector block 402. Opening 408 is disposed so that as thumbscrew 406 is advanced into it, a portion of the thumbscrew extends into the receptacle opening 404 so as to firmly attach the connector 402 to the battery negative post. An opening 410 is provided in circular portion 403 on the other side of receptacle opening 404 and extending through the connector block into communication with the receptacle opening. When the battery analyzing apparatus is connected to a battery having a threaded opening in the top of the negative post, such as are typical on side post automotive batteries, the thumbscrew 406 may be placed through opening 410 and advanced into the threaded opening on the battery post to secure the connector block 402 to the battery post.

The connector block shank portion 403 additionally has three openings 412, 414, and 416 at the base thereof and extending lengthwise through it. Opening 412 is sufficiently large to receive the electrical conductor which is coupled to the current shunt 16, whereas opening 414 need only be sufficiently large to receive the conductor coupled to the inputs of amplifier circuits 122 and 126. Opening 416 is of sufficient diameter to receive thermocouple 130 and its connecting wires 200 and 208 and retain the thermocouple 130 in thermal contact with the connector block 402. Opening 416 extends through the shank portion 405 into the circular portion 403 to permit the thermocouple 130 to be in thermal contact with the connector block 402 at a position relatively close to the receptacle opening 404. Threaded openings 418, 420, and 422 are provided in the connector block 404 and each is in communication with one of openings 412, 414, and 416, respectively, for receiving set screws to retain the associated conductors in the openings 412, 414, and 416. In an apparatus constructed in accord with this invention, the connector block had an overall length of 2.50 inches, a width of 1.00 inches, and the circular portion 403 and the shank portion 405 had thicknesses of 0.79 and 0.70 inches, respectively. In that apparatus, the time constant t of the connector block was approximately 30 seconds and thus was in the presently preferred range of approximately 25 to 35 seconds.

A flow chart disclosing the operation of the automatic battery analyzer of FIGS. 3–6 is shown in FIGS. 7a–7e, the presence of the same reference letters on different lines of those FIGS. 7a–7e indicating that those lines are connected together. As soon as the automatic battery analyzer is turned on by applying power thereto, a loop 500 is entered which successively measures and stores the temperature of the connector block 402, scans the pushbutton switches 144 and 146 to see if either one has been closed, and measures the potential across the battery connectors. As long as the voltage across the battery connectors is within the range of plus or minus 2.0 volts, it is assumed that the battery analyzer has not yet been connected to the battery under test and that the measured temperature of the connector block, $T_A$, is the ambient temperature. When the measured voltage across the battery connector is outside the plus or minus 2.0 volt range, a second loop 502 is entered which skips the temperature measurement and storage steps of loop 500 since the connector block is no longer at ambient temperature but is at some temperature between the ambient temperature and the battery post temperature. Thus, after the connector is attached to the battery under test, the stored value of $T_A$ is temperature of the connector measured at the most recent time prior to connection of the connector to the battery.

When either of switches 144 or 146 is closed, a lamp test procedure 504 is performed by which all of the light emitting diodes 170–184 are simultaneously illuminated for a period of five seconds so that the operator may verify that each of them is functional. Another loop 506 is then entered which reads the battery voltage and, if that voltage is negative, turns on the light emitting diode 184 indicating to the operator that he has incorrectly connected the battery analyzer to the tester and that the positive and negative connectors should be reversed. If this occurs, the analyzer returns to the loop 500 when it is disconnected from the battery under test. After loop 506, the light emitting diode 170 is turned on to indicate that a test is in progress, the appropriate registers are set to zero, and the battery voltage is again read. If the battery voltage is less than 10.8 volts (for a nominal 12 volt battery) at the commencement of the test with no load applied to it, the battery is assumed to be unacceptable, light emitting diode 176 is turned on indicating that the battery under test is unacceptable, light emitting diode 182 is turned on indicating that the battery terminal voltage is excessively low, light emitting diode 170 is turned off indicating the test has terminated, and the analyzer returned to loop 502 and, after the bad battery is disconnected from the analyzer, to loop 500, in readiness for the next test.

If the battery voltage at the beginning of the test is greater than 10.8 volts, a battery temperature calculation procedure 508 is performed to determine the temperature of the battery under test. First a fifty-five second time delay is introduced which, when added to the five second period of the lamp test routine 504, yields a total time delay of sixty seconds from the time the switch 144 or 146 was closed. At the end of that sixty second period the temperature of the connector block, $T_B$, is measured. In the disclosed apparatus, two possible routines are used to determine battery temperature, $T_E$, depending upon whether the difference between $T_A$ and $T_B$ is greater than 2° F. If that difference is greater than 2° F., the battery temperature is calculated as follows:

$$T_E = (T_B - 0.78 T_A)/0.37$$

If the difference not greater than 2° F., the battery temperature is calculated as follows:

$$T_E = (T_B - 0.54 T_A)/0.49$$

After the battery temperature is determined, that temperature is used as an input to the testing procedure carried out. One example of such test procedures are those disclosed in the aforementioned application Ser. No. 863,925 wherein tests were run on the performance of the battery under load, its bounce back voltage, and on an internal impedance of the battery. In the analyzer of FIGS. 3–7, load and bounce back tests similar to those used in Ser. No. 863,925 are used, but the third test used is one which detects the presence of a bad cell within the battery under test and is more fully described and discussed in the copending application of T. J. Dougherty, C. J. Frailing and R. T. Johnson entitled "Automatic Battery Analyzer Including Apparatus for Determining the Presence of a Single Bad Cell", and being filed contemporaneously herewith. As the first step in performing the load and bounce back voltage tests, the load and bounce back reference voltages are determined from the determined battery temperatures and stored in memory. The calculated reference voltages are referred to as ERFTMP and EBBTMP in FIG. 7 and Table 1. The relationships between the two reference voltages and battery temperature are shown in FIGS. 4a and 4b of said application Ser. No. 863,925. At the initiation of the load test, light emitting diode 180 is illuminated to indicate that the load test is in progress and the cold cranking rating of the battery is read from the potentiometer 136 previously adjusted by the operator to correspond to the cold cranking rating of the battery under test. That rating is a value in amperes and is the current the battery is intended to be able to deliver for a period of thirty seconds at zero degrees Fahrenheit without the battery terminal voltage falling below 7.2 volts for a conventional, six-cell, twelve volt lead-acid storage battery. The relays in the load bank relays 120 are then closed to place the corresponding resistances across the battery under test and load it to deliver a current of approximately one-half its cold cranking rating. The battery current is monitored by measurement of the voltage across the shunt 116 and if the difference between the actual current and one-half the cold cranking rating is greater than approximately 9 amperes, the load is altered to bring the current closer to one-half of the cold cranking rating. The battery terminal voltage is measured during the load test. If at the end of twenty seconds that voltage exceeds the previously determined ERFTMP the battery under test is assumed to be acceptable, the load is removed from the battery, light emitting diodes 180 and 170 are extinguished, light emitting diode 178 is energized to indicate that the battery under test has been determined to be acceptable, and the tester returns to loops 500 and 502 in preparation for the next test. If the battery terminal voltage falls below ERFTMP at any time during the load test, the battery is assumed to have failed the load test, light emitting diode 180 is extinguished, and the load is removed from the battery. In the event that load test failure occured while the battery under test is being retested and is known to have been fully charged (i.e., the test sequence was initiated by closure of pushbutton switch 146), the battery is then known to be unacceptable. Light emitting diodes 176 and 170 are illuminated and extinguished, respectively, and the analyzer is returned to loops 501 and 502 in preparation for the next test. If the load test failure occurred during an initial test of the battery, the voltage bounce back test is performed by measuring the battery voltage fifteen seconds after termination of the load test. If that measured voltage exceeds EBBTMP, the battery has passed the bounce back voltage test but is assumed to be unacceptable, light emitting diodes 176 and 170 are illuminated and extinguished, respectively, and the analyzer is returned to loops 500 and 502 in preparation for the next test. If that measured voltage is less than EBBTMP, the condition of the battery is still undertermined and the test to determine the presence of a bad cell is performed.

The first step in the bad cell detection test is to clear a register labelled BATVL. A temperature corrected standard voltage, BATVTC, is then calculated as follows:

$$BATVTC = [(0.870 + (1.30 \times CCR)]$$
$$(ERFTMP + 0.70)$$

A fixed resistance load of 0.1 ohm then placed across the battery by closing the contact pair 314. After a five second delay, a loop procedure 520 is executed during which the voltage across the battery terminals is measured each second and the result of each voltage measurement is compared with the voltage measurement made the previous second.

In the case of a normally operating battery, the voltage supplied to a fixed resistance load is a monotonically decreasing function of time after an initial period of discharge. Here the initial period is taken as five seconds. After that initial period and while the constant resistance load is placed across the battery terminals the terminal voltage measured at any time exceeds the voltage measured in the preceeding second, it is known that the terminal voltage is increasing. The first time the measured battery voltage exceeds the voltage measured the previous second, the previously measured voltage is stored in the BATVL register. That stored voltage is assumed to be the minimum battery voltage. If while the constant resistance load is across the battery terminals, the measured battery terminal voltage exceeds the minimum battery terminal voltage by 0.17 volts, the battery is assumed to have a bad cell and thus to be unacceptable, light emitting diode 176 is illuminated, the relay contacts 314 are opened to remove the load from the battery, light emitting diode 170 is extinguished, and the tester returns to loops 500 and 502 in preparation for the next test.

Loop 520 is also exited after a ten second time period at point 524. If at that time the battery terminal voltage measured during the proceeding second exceeds the previously determined BATVTC, the battery is assumed to be acceptable but in need of a recharge before being returned to service; in this case light emitting diode 174 is illuminated to make the proper indication to the operator, relay contacts 316 are opened to remove the load from the battery, light emitting diode 170 is extinguished, and the tester returns to loops 500 and 502 in preparation for the next test. If at that same time the battery terminal voltage measured during the proceeding second does not exceed the previously determined BATVTC, a loop 526 is entered which is quite similar to the loop 520 and carries out the constant resistance load test for another five seconds while continuing to look for increases in the battery terminal voltage. If the battery terminal voltage should increase during that additional five second period and if the battery terminal voltage should exceed by 0.17 volts the minimum value thereof obtained during either that period or the previous 10 second period, the battery is again assumed to have a bad cell and to be unacceptable, light emitting diode 176 and 170 are illuminated and extinguished, respectively, the load is removed from the battery, and the tester returns to loops 500 and 502 in preparation for the next test. If during that additional five second period the battery is not thus determined to be unacceptable, then it is assumed that insufficient information concerning the battery is available to determine its condition and the battery must be recharged and retested to determine its acceptability. In this case, light emitting diode 172 is illuminated to give the proper indication, the load is removed from the battery, light emitting diode 170 is extinguished, and the tester returned to loops 500 and 520 in preparation for the next test.

A program for the 6802 microprocessor in assembly language to execute the program of the flow charts of FIGS. 7a-7e is at Table I as follows:

```
                          GLOBE UNION BATTERY TESTER

00001                         OPT     PAGE=43,LLEN=110
00002                         OPT     S
00003                         TTL     GLOBE UNION BATTERY TESTER
00004                         NAM     BATT
00006                  * RAM DEFINITIONS; PIA DEFINITIONS
00007                  *
00008                  *THIS PAGE DEFINES ALL LABELS USED IN ALL PROGRAMS. IT
00009                  *ALSO DEFINES THE LOCATIONS OF THE 3 PIAS.
00010                  *
00011                  *
00012       0080    A PIA1AD  EQU     $80
00013       0081    A PIA1AC  EQU     $81
00014       0082    A PIA1BD  EQU     $82
00015       0083    A PIA1BC  EQU     $83
00016       0084    A PIA2AD  EQU     $84
00017       0085    A PIA2AC  EQU     $85
00018       0086    A PIA2BD  EQU     $86
00019       0087    A PIA2BC  EQU     $87
00020       0088    A PIA3AD  EQU     $88
00021       0089    A PIA3AC  EQU     $89
00022       008A    A PIA3BD  EQU     $8A
00023       008B    A PIA3BC  EQU     $8B
00024                  *
00025                  *
00026A 0000                   ORG     $0             BEGINNING OF RAM
00027A 0000 0001    A LINDEL  RMB     1              A/D DELAY TIME
00028A 0001 0001    A ATODN   RMB     1              A/D LINE NUMBER
00029A 0002 0004    A ATODD   RMB     4              MSD --- --- LSD
00030A 0006 0001    A DECPT   RMB     1              LOCATION OF DECIMAL POINT
00031A 0007 0002    A IXH     RMB     2              HIGH BYTE OF INDEX REGISTER
00032A 0009 0001    A LMPCOL  RMB     1              LAMP COLUMN NUMBER KEEP IN 1
00033A 000A 0001    A LMPROW  RMB     1              LAMP ROW NUMBER
00034A 000B 0001    A LMPST1  RMB     1              SCRATCH FOR LAMPS
00035A 000C 0001    A LMPST2  RMB     1              SCRATCH FOR LAMPS
00036A 000D 0001    A BCDNEG  RMB     1              SIGN OF BCDTOH NUMBER
00037A 000E 0002    A DATAH   RMB     2
00038A 0010 0001    A STACK1  RMB     1
00039A 0011 0001    A NCTH    RMB     1
00040A 0012 0001    A NCTL    RMB     1
00041A 0013 0002    A ETMPH   RMB     2              ETMP=TEMP COMPENSATED VOLTAGE
00042A 0015 0002    A EBTMPH  RMB     2
00043A 0017 0002    A TEMPHX  RMB     2
00044A 0019 0001    A SPDONE  RMB     1
00045A 001A 0001    A SPDZRO  RMB     1
00046A 001B 0001    A SPDSTO  RMB     1
00047A 001C 0001    A SPDFLP  RMB     1
00048A 001D 0001    A SPDTRU  RMB     1
00049A 001E 0002    A SPDPER  RMB     2
00050A 0020 0001    A RIPSTA  RMB     1              10 SEC COUNTER STORAGE
00051A 0021 0001    A ACNODS  RMB     1
00052A 0022 0002    A BATVL   RMB     2
00053A 0024 0002    A BATVTC  RMB     2
00054A 0026 0002    A BATVA   RMB     2
00055A 0028 0002    A CCSH    RMB     2
00056A 002A 0002    A VCTR10  RMB     2
00057A 002C 0001    A PIASTO  RMB     1
00058A 002D 0001    A BATCTR  RMB     1
00059A 002E 0001    A BCNSJR  RMB     1
00060A 002F 0001    A VEHCTR  RMB     1
00061A 0030 0001    A VEHDVD  RMB     1
00062A 0031 0001    A XFIELD  RMB     1
00063A 0032 0001    A REGCTR  RMB     1
00064A 0033 0001    A DISCTL  RMB     1
00065A 0034 0001    A ADIRQ   RMB     1
00066A 0035 0001    A ROLCNT  RMB     1
00067A 0036 0001    A RELNUM  RMB     1
00068A 0037 0001    A RELKA   RMB     1
00069A 0038 0004    A STRDRW  RMB     4              STARTER CURRENT 1 KEEP
00070A 003C 0004    A ALTOUT  RMB     4              ALTERNATOR CURRENT 2 IN
00071A 0040 0004    A VLTREG  RMB     4              VOLTAGE REGULATOR 3 ORDER
00072A 0044 0004    A DISREG  RMB     4              DISPLAY REGISTER
00073A 0048 0001    A CTR     RMB     1
00074A 0049 0002    A IXH1    RMB     2
```

BATT    GLOBE UNION BATTERY TESTER

```
00075A 004B      0001   A TEMPER RMB    1
00076A 004C      0001   A BCDCTR RMB    1
00077            004D   A DIVEND EQU    *
00078A 004D      0001   A        RMB    1       MOST SIGNIFICANT BIT IN DIVIDE
00079A 004E      0002   A MULCND RMB    2
00080A 0050      0002   A MULPYR RMB    2
00081A 0052      0002   A DIVSOR RMB    2
00082A 0054      0002   A RESULT RMB    2
00083A 0056      0001   A DLYTIM RMB    1
00084A 0057      0001   A KFLASH RMB    1
00085A 0058      0002   A POSTMV RMB    2
00086A 005A      0002   A AMBMV  RMB    2
00087A 005C      0002   A POSTTM RMB    2
00088A 005E      0002   A AMBTM  RMB    2
00089A 0060      0002   A NEWTMP RMB    2
00090A 0062      0002   A VALUE  RMB    2
00091A 0064      0001   A SETNEG RMB    1
00092A 0065      0001   A FSHFST RMB    1
00094A F000                     ORG    $F000
00095                           *
00096                           *RESTART ROUTINE
00097                           *
00098A F000 8E 007F A RESTAR LDS    #$007F   INITIALIZE STACK POINTER
00099A F003 0F               SEI              SET THE INTERRUPT MASK
00100A F004 7F 0057 A        CLR    KFLASH
00101A F007 7F 0033 A        CLR    DISCTL
00102                        *
00103                        *INITIALIZE PIAS
00104A F00A 4F               CLRA
00105A F00B 97 65   A        STAA   FSHFST    SET FOR SLOW FLASH FOR VEHICLE TEST
00106A F00D 97 81   A        STAA   PIA1AC
00107A F00F 97 83   A        STAA   PIA1BC
00108A F011 97 85   A        STAA   PIA2AC
00109A F013 97 87   A        STAA   PIA2BC
00110A F015 97 89   A        STAA   PIA3AC
00111A F017 97 8B   A        STAA   PIA3BC
00112A F019 86 FF   A        LDAA   #$FF
00113A F01B 97 84   A        STAA   PIA2AD    PIA2A=OUTPUT
00114A F01D 97 86   A        STAA   PIA2BD    PIA2B=OUTPUT
00115A F01F 97 8A   A        STAA   PIA3BD    PIA3B=OUTPUT
00116A F021 86 F7   A        LDAA   #$F7      ONE INPUT SEVEN OUTPUTS
00117A F023 97 88   A        STAA   PIA3AD
00118                        *
00119A F025 86 04   A        LDAA   #$04
00120A F027 97 81   A        STAA   PIA1AC    SELECT PERIPHERAL REGISTERS
00121A F029 97 83   A        STAA   PIA1BC
00122A F02B 86 34   A        LDAA   #$34      SELECT PERIPHERAL REGISTERS
00123A F02D 97 89   A        STAA   PIA3AC    AND SET CB2=CA2=0
00124A F02F 97 8B   A        STAA   PIA3BC
00125A F031 97 85   A        STAA   PIA2AC
00126A F033 97 87   A        STAA   PIA2BC
00127A F035 CE 5555 A        LDX    #$5555
00128A F038 DF 5A   A        STX    AMBMV     SET AMBIENT FOR 80 DEG. F
00129A F03A BD F06C A        JSR    CLRGST    CLEAR STRDRW,ALTOUT,VLTREG
00130A F03D BD F658 A        JSR    LMPSOF    ALL LAMPS OFF
00131A F040 7E F65D A        JMP    PCLEAR    SCAN PUSHBUTTONS
00132                        TTL    BATTERY TEST PROGRAM
00133                        NAM    BATEST
00135                  *         PROGRAM BATEST
00136                  *THIS PROGRAM TESTS THE BATTERY. IT SENSES THE CURRENT
00137                  *THRU A LOAD BANK AND THE TERMINAL VOLTAGE. IT LOADS
00138                  *THE BATTERY AND RECORDS DATA. SEE BLOCK DIAGRAM.
00139                  *
00140                  *
00141A F043 86 01   A RETEST LDAA   #$01
00142A F045 97 2E   A        STAA   BCNSTR    BCNSTR=1
00143A F047 20 03 F04C       BRA    BSTART
00144A F049 7F 002E A BATEST CLR    BCNSTR
00145A F04C BD F658 A BSTART JSR    LMPSOF    TURN ALL LAMPS OFF
00146                        *
00147                        *TURN ON LAMPS FOR 5 SECONDS
00148                        *
00149A F04F CE 00FF A        LDX    #$00FF    ALL LAMPS ON
00150A F052 BD F23E A        JSR    LPONOF
00151                        *
00152                        *CHECK REVERSE POLARITY AND MAGNITUDE
00153                        *
00154A F055 BD F468 A BRDBAT JSR    RDBATV    GO READ BATV
00155A F058 96 0D   A        LDAA   BCDNEG    IS VOLTAGE NEGATIVE?
00156A F05A 2A 2E F08A       BPL    BATCLR    B=PLUS
00157A F05C 96 02   A        LDAA   ATODD     MOST SIG. DIGIT
00158A F05E 9B 03   A        ADDA   ATODD+1   ADD IN NEXT DIGIT
00159A F060 84 7F   A        ANDA   #$7F      STRIP SIGN
00160A F062 27 26 F08A       BEQ    BATCLR    B=POSITIVE
00161A F064 CE 0001 A BTPNEG LDX    #$0001    REV POLARITY ON
00162A F067 BD F7C9 A        JSR    LAMPS
```

BATEST BATTERY TEST PROGRAM

```
00163A F06A 20 E9 F055              BRA     BRDBAT  GO READ AGAIN
00164                        *
00165                        *       SUBROUTINE CLRGST
00166                        *THIS SUBROUTINE CLEARS STRDRW,ALTOUT,VLTREG
00167                        *
00168A F06C CE 0035  A CLRGST LDX    #RDLCNT GET ADDRESS OF REGISTERS
00169A F06F 6F 00    A BTMCLR CLR    0,X
00170A F071 08                INX            NEXT ONE
00171A F072 BC 004C  A        CPX    #BCDCTR
00172A F075 26 F8 F06F         BNE   BTMCLR
00173A F077 39         RET1   RTS
00174       F078     A RDTEMP EQU    *
00175A F078 97 01    A        STAA   ATODN   SELECT TEMP INPUT
00176A F07A BD F6A7  A        JSR    ATOD
00177A F07D 96 33    A        LDAA   DISCTL
00178A F07F 2B F6 F077        BMI    RET1
00179A F081 CE 0002  A BCDNOW LDX    #ATODD  ADDRESS OF DATA TO X
00180A F084 7E F81D  A        JMP    BCDTOH  CONVERT BCD TO HEX. DATAH=TEMP=X
00181       F087     A BADBAT EQU    *       BAD BATTERY
00182A F087 7E F1CA  A        JMP    BATBBN  BAD BATTERY LITE
00183                        *
00184                        *
00185A F08A 8D E0 F06C BATCLR BSR   CLRGST   CLEAR REGISTERS
00186                        *
00187A F08C BD F468  A        JSR    RDBATV  READ BATTERY VOLTAGE
00188A F08F C0 38    A        SUBB   #$38    IS VOLTAGE > 10.80
00189A F091 82 04    A        SBCA   #$4
00190A F093 2B F2 F087        BMI    BADBAT  B=NO
00191                        *
00192                        *
00193                        * SEE IF AMBIENT TEMPERATURE WAS READ
00194                        *
00195A F095 DE 5A    A        LDX    AMBMV
00196A F097 8C 5555  A        CPX    #$5555
00197A F09A 26 22 F0BE        BNE    DLYST
00198A F09C CE 00FF  A BLINK  LDX    #$00FF  FLASH ALL BATTERY LIGHTS
00199A F09F BD F7C9  A        JSR    LAMPS
00200A F0A2 BD F4EB  A        JSR    WATQTR
00201A F0A5 BD F658  A        JSR    LMPSOF
00202A F0A8 4F                CLRA
00203A F0A9 BD F468  A        JSR    RDBATV  READ BATTERY VOLTAGE
00204A F0AC 4D                TSTA           SEE IF STILL CONNECTED
00205A F0AD 2B 08 F0B7        BMI    LSBTST
00206A F0AF 26 EB F09C        BNE    BLINK
00207A F0B1 C1 02    A        CMPB   #2      SEE IF > 2
00208A F0B3 2C E7 F09C        BGE    BLINK   BR. IF YES
00209A F0B5 20 04 F0BB        BRA    STOVER
00210A F0B7 C1 FE    A LSBTST CMPB   #-2     SEE IF > -2
00211A F0B9 25 E1 F09C        BCS    BLINK   BR IF YES
00212A F0BB 7E F000  A STOVER JMP    RESTAR
00213                        *READ TEMPERATURE
00214                        *
00215A F0BE 86 28    A DLYST  LDAA   #$28    SET FOR 50 SEC. APPROX.
00216A F0C0 97 56    A        STAA   DLYTIM
00217A F0C2 4F         TMPAGN CLRA           SELECT TEMP INPUT
00218A F0C3 8D B3 F078        BSR    RDTEMP  GO READ TEMP.
00219A F0C5 7D 004B  A        TST    TEMPER
00220A F0C8 2B F8 F0C2        BMI    TMPAGN
00221A F0CA CE 0080  A        LDX    #$0080  SET TEST IN PROGRESS LAMP
00222A F0CD BD F7C9  A        JSR    LAMPS
00223A F0D0 CE 03E8  A        LDX    #1000   WAIT 1 SEC.
00224A F0D3 BD F8E7  A        JSR    WAITFO
00225A F0D6 7A 0056  A        DEC    DLYTIM
00226A F0D9 26 E7 F0C2        BNE    TMPAGN
00227A F0DB 4F         STTMP  CLRA
00228A F0DC 8D 9A F078        BSR    RDTEMP  GO READ TEMP
00229A F0DE 7D 004B  A        TST    TEMPER
00230A F0E1 2B DB F0BE        BMI    DLYST
00231A F0E3 DF 58    A        STX    POSTMV  STORE POST TEMP FOR ADJUSTED TEMPERATURE CALC.
00232A F0E5 BD F9B5  A        JSR    CALFF   CALC. ADJ. TEMP.
00233A F0E8 DF 17    A        STX    TEMPHX  STORE TEMPERATURE IN HEX AT TEMPHX
00234                        *
00235                        *GENERATE ERFTMP, EBTMPH TEMPERATURE COMPENSATED
00236                        *REFERENCE VOLTAGE AND BOUNCE BACK VOLTAGE.
00237                        *
00238A F0EA BD F862  A        JSR    ERFTMP  TEMP COMP VOLTAGE=ETMPH=DDDD
00239A F0ED BD F8B9  A        JSR    EBBTMP  TEMP COMP BOUNCE BCK VOLT=EBTMPH
00240                        *
00241A F0F0 CE 0084  A        LDX    #$0084  TEST IN PROGRESS ON
00242A F0F3 BD F7C9  A        JSR    LAMPS   AND KW TEST IN PROGRESS ON
00243                        *
00244A F0F6 86 07    A        LDAA   #$7
00245A F0F8 BD F078  A        JSR    RDTEMP  GO READ COLD CRANK
00246A F0FB DF 28    A        STX    CCSH    CCSH=COLD CRNK SETTING IN HEX
00247                        *
00248A F0FD 86 33    A        LDAA   #$33    GO THRU 51X(.393 SEC) TIMES
```

BATEST BATTERY TEST PROGRAM

```
00249A F0FF 97 2D     A              STAA    BATCTR   LOAD COUNTER FOR 20 SEC
00250A F101 7F 0036   A              CLR     RELNUM   RELNUM=0

00252                                *
00253                                *LOAD BATTERY DOWN
00254                                *
00255A F104 86 40     A              LDAA    #$40     SET XX.XX
00256A F106 97 06     A              STAA    DECPT
00257A F108 96 88     A  BATLUP LDAA  PIA3AD
00258A F10A 85 08     A              BITA    #$08
00259A F10C 26 07 F115             BNE    BTDISP
00260A F10E 86 04     A              LDAA    #$4
00261A F110 BD F078   A              JSR     RDTEMP
00262A F113 20 18 F12D               BRA     NODIS1
00263A F115 86 80     A  BTDISP LDAA  #$80
00264A F117 97 33     A              STAA    DISCTL
00265A F119 86 04     A              LDAA    #$4
00266A F11B BD F078   A              JSR     RDTEMP   GO READ VOLTAGE
00267A F11E 96 33     A  DRLOOP LDAA  DISCTL           TEST ATOD BUSY
00268A F120 2A 08 F12A               BPL     CONTDR   B=NO
00269A F122 CE 0044   A              LDX     #DISREG
00270A F125 BD F74D   A              JSR     DISPLA   DISPLAY DATA
00271A F128 20 F4 F11E               BRA     DRLOOP
00272           F12A  A CONTDR EQU   *
00273A F12A BD F081   A              JSR     BCDNOW
00274                                *
00275                                *SUBTRACT CCSH-BATSH
00276                                *
00277A F12D 96 29     A  NODIS1 LDAA  CCSH+1   ACCA=CCSH, 3 AMPS/DIGIT
00278                                * ACCB=BATSH, 3 AMPS/DIGIT              *
00279A F12F 10                       SBA              ACCA=ACCA-ACCB=CCSH-BATSH=ERROR
00280A F130 81 03     A              CMPA    #$03
00281A F132 2A 05 F139               BPL     BEZAB    BR IF ERR>3
00282A F134 81 FD     A              CMPA    #-3
00283A F136 2B 01 F139               BMI     BEZAB    BR IF ERR<-
00284A F138 4F                       CLRA             ACCA=0;  NO CHANGE
00285A F139 D6 36     A  BEZAB LDAB   RELNUM           ACCB=RELNUM
00286A F13B 1B                       ABA              ACCA=RELNUM+ERROR
00287A F13C 2A 02 F140               BPL     BRLDOK   BR IF RESULT POSITIVE (OK)
00288A F13E 86 7F     A              LDAA    #$7F     ACCA=$7F IF RESULT NEGATIVE, FULL LOAD
00289           F140  A BRLDOK EQU   *
00290A F140 BD F8D5   A              JSR     RELAY    UPDATE LOAD RELAYS
00291A F143 8D 1E F163              BSR     DISBTV
00292A F145 D0 14     A              SUBB    ETMPH+1  COMPARE TO TEMP COMPENSATED VALUE
00293A F147 92 13     A              SBCA    ETMPH
00294A F149 2B 5C F1A7              BMI     BATLSB   B=BATV<ETMPH
00295A F14B 7A 002D   A  BATXX DEC   BATCTR   T=20 SEC?
00296A F14E 26 B8 F108               BNE     BATLUP
00297A F150 CE 0008   A  BTGOOD LDX   #$0008   GOOD LAMP ON
00298A F153 8D 7C F1D1 CHARLI BSR    LAMPSO
00299                                *
00300A F155 CE F084   A  BTLTOF LDX   #$F084   KW TEST IN PROGRESS OFF
00301A F158 8D 77 F1D1              BSR     LAMPSO   AND TEST IN PROGRESS OFF
00302                                *
00303A F15A 4F               BTDONE CLRA              UNLOAD
00304A F15B 97 37     A              STAA    RELKA
00305A F15D BD F8D5   A              JSR     RELAY    BATTERY
00306A F160 7E F65D   A              JMP     PCLEAR   SCAN PUSHBUTTONS
00307                                *
00308A F163 96 88     A  DISBTV LDAA  PIA3AD
00309A F165 85 08     A              BITA    #$08
00310A F167 26 06 F16F               BNE     DISBVO
00311A F169 BD F4EB   A              JSR     WATQTR
00312A F16C 7E F468   A              JMP     RDBATV
00313A F16F 86 0C     A  DISBVO LDAA  #$C     DELAY FOR 250 MS.
00314A F171 97 49     A              STAA    IXH1
00315A F173 86 80     A              LDAA    #$80     SET DISPLAY IN PROGRESS
00316A F175 97 33     A              STAA    DISCTL
00317                                *
00318A F177 BD F468   A              JSR     RDBATV   X=BATV IN HEX
00319A F17A 96 33     A  DRNLOP LDAA  DISCTL           TEST ATOD BUSY
00320A F17C 2A 10 F18E               BPL     NBUSY2
00321A F17E CE 0044   A              LDX     #DISREG
00322A F181 BD F74D   A              JSR     DISPLA
00323A F184 7A 0049   A              DEC     IXH1
00324A F187 26 F1 F17A               BNE     DRNLOP
00325A F189 7C 0049   A              INC     IXH1
00326A F18C 20 EC F17A               BRA     DRNLOP
00327A F18E DE 02     A  NBUSY2 LDX   ATODD
00328A F190 DF 44     A              STX     DISREG
00329A F192 DE 04     A              LDX     ATODD+2
00330A F194 DF 46     A              STX     DISREG+2
00331A F196 CE 0044   A  DRNLP1 LDX   #DISREG
00332A F199 BD F74D   A              JSR     DISPLA
```

BATEST BATTERY TEST PROGRAM

```
00333A F19C 7A 0049  A            DEC     IXH1
00334A F19F 26 F5 F196            BNE     DRNLP1
00335A F1A1 CE 0002  A            LDX     #ATODD
00336A F1A4 7E F081  A            JMP     BCDNOW
00337                       *
00338                       *LOW BATTERY VOLTAGE ROUTINES
00339                       *
00340A F1A7 96 2E    A   BATLS8   LDAA    BCNSTR      CHECK TEST MODE
00341A F1A9 26 1F F1CA            BNE     BATBBN      BR IF IN RETEST MODE
00342A F1AB CE 0002  A            LDX     #$0002      LOW VOLTAGE ON
00343A F1AE 8D 21 F1D1            BSR     LAMPSO
00344                       *
00345A F1B0 CE F004  A            LDX     #$F004      KW TEST IN PROGRESS OFF
00346A F1B3 8D 1C F1D1            BSR     LAMPSO
00347                       *
00348A F1B5 4F                    CLRA                UNLOAD
00349A F1B6 BD F8D5  A            JSR     RELAY       BATTERY
00350                       *
00351                       *CHECK BOUNCE BACK VOLTAGE
00352                       *
00353A F1B9 86 35    A            LDAA    #$35        COUNTER FOR 15 SEC.
00354A F1BB 97 2D    A            STAA    BATCTR
00355A F1BD 8D A4 F163   EBLOOP   BSR     DISBTV
00356A F1BF 7A 002D  A            DEC     BATCTR
00357A F1C2 26 F9 F1BD            BNE     EBLOOP
00358                       * REG A HAS HI BATV, REG B HAS LO BATV
00359A F1C4 D0 16    A            SUBB    EBTMPH+1    ACCB=LO(E-EBB)
00360A F1C6 92 15    A            SBCA    EBTMPH      ACCA=HI(E-EBB)
00361A F1C8 2D 0A F1D4            BLT     BATCON      BR IF E<EBB
00362     .                 *
00363                       * BAD BATTERY
00364                       *
00365A F1CA CE 0010  A   BATBBN   LDX     #$0010      BAD LAMP ON
00366A F1CD 8D 02 F1D1            BSR     LAMPSO
00367A F1CF 20 84 F155            BRA     BTLTOF
00368A F1D1 7E F7C9  A   LAMPSO   JMP     LAMPS
00369                       *
00370                       * CONDUCTANCE TEST
00371                       *
00372A F1D4 4F           BATCON   CLRA
00373A F1D5 97 22    A            STAA    BATVL       CLEAR BATVL
00374A F1D7 97 23    A            STAA    BATVL+1
00375A F1D9 DE 28    A            LDX     CCSH        CCSH=0.XXX
00376A F1DB 4F                    CLRA                CCSH X 1.30
00377A F1DC C6 82    A            LDAB    #$82
00378A F1DE BD F284  A            JSR     MULT        =.XXXXX
00379A F1E1 CE 004D  A            LDX     #DIVEND
00380A F1E4 4F                    CLRA                DIV. BY 10
00381A F1E5 C6 0A    A            LDAB    #10
00382A F1E7 BD F2AD  A            JSR     DIVIDE      ANSWER WILL =0.XXXX
00383A F1EA 96 54    A            LDAA    RESULT      ADD .8700
00384A F1EC D6 55    A            LDAB    RESULT+1
00385A F1EE CB FC    A            ADDB    #$FC
00386A F1F0 89 20    A            ADCA    #$20
00387A F1F2 97 4E    A            STAA    MULCND
00388A F1F4 D7 4F    A            STAB    MULCND+1
00389A F1F6 DE 4E    A            LDX     MULCND      ((CCSH*1.30)+.870)=X.XXXX
00390A F1F8 96 13    A            LDAA    ETMPH       ETEMPH= XX.XX
00391A F1FA D6 14    A            LDAB    ETMPH+1
00392A F1FC CB 46    A            ADDB    #70         ADD .7 TO ERFTEMP
00393A F1FE 89 00    A            ADCA    #0
00394A F200 BD F284  A            JSR     MULT        ((.870+CCSH*1.30))*(ERFTMP+.7)
00395A F203 CE 004D  A            LDX     #DIVEND     ANSWER WILL=XX.XXXXXX
00396A F206 86 27    A            LDAA    #$27        DIVIDE BY 10000
00397A F208 C6 10    A            LDAB    #$10
00398A F20A BD F2AD  A            JSR     DIVIDE
00399A F20D DF 24    A            STX     BATVTC      (.870+(CCSH*1.30)(ERFTEMP+.7))=XX.XX
00400A F20F 86 10    A            LDAA    #$10        TURN ON RELAY KL
00401A F211 97 37    A            STAA    RELKA
00402A F213 4F                    CLRA
00403A F214 BD F8D5  A            JSR     RELAY
00404A F217 86 11    A            LDAA    #$11        5 SEC.
00405A F219 97 2D    A            STAA    BATCTR
00406A F21B BD F163  A   CONLP1   JSR     DISBTV
00407A F21E 7A 002D  A            DEC     BATCTR
00408A F221 26 F8 F21B            BNE     CONLP1      B=5 SEC. NOT UP
00409A F223 86 09    A            LDAA    #$9         10 SEC.
00410A F225 8D 23 F24A            BSR     CONTST
00411A F227 CE 0020  A            LDX     #$0020
00412A F22A 96 26    A            LDAA    BATVA
00413A F22C D6 27    A            LDAB    BATVA+1
00414A F22E D0 25    A            SUBB    BATVTC+1
00415A F230 92 24    A            SBCA    BATVTC
00416A F232 2A 07 F23B            BPL     GRECRG      B=GOOD RECHARGE
00417A F234 86 05    A            LDAA    #$5         5 SEC.
00418A F236 8D 12 F24A            BSR     CONTST
```

BATEST BATTERY TEST PROGRAM

```
00419A F238 CE 0040   A            LDX      #$40        RECRG RETEST
00420A F23B 7E F153   A  GRECRG    JMP      CHARLI
00421                          *
00422                          *
00423          F23E   A  LPONOF    EQU      *
00424A F23E BD F7C9   A            JSR      LAMPS
00425A F241 CE 1162   A            LDX      #$4450      WAIT FOR 5 SEC.
00426A F244 BD F8E7   A            JSR      WAITFO
00427A F247 7E F658   A            JMP      LMPSOF      TURN ALL LAMPS OFF
00428                          *
00429                          *
00430A F24A 97 00     A  CONTST    STAA     LINDEL
00431A F24C 86 03     A  CONLP3    LDAA     #$3         1 SEC.
00432A F24E 97 2D     A            STAA     BATCTR
00433A F250 BD F163   A            JSR      DISBTV
00434A F253 DF 26     A            STX      BATVA       STORE BATV IN BATVA
00435A F255 BD F163   A  CONLP2    JSR      DISBTV      WAIT ONE SEC.
00436A F258 7A 002D   A            DEC      BATCTR
00437A F25B 26 F8 F255            BNE      CONLP2
00438A F25D D0 27     A            SUBB     BATVA+1     IS BATV>BATVA
00439A F25F 92 26     A            SBCA     BATVA
00440A F261 2B 1B F27E            BMI      STILOK      B=NO
00441A F263 DE 22     A            LDX      BATVL       IS BATVL CLEARED
00442A F265 26 04 F26B            BNE      TSTVL       B=NO
00443A F267 DE 26     A            LDX      BATVA
00444A F269 DF 22     A            STX      BATVL       STORE BATV AT BATVL
00445A F26B 96 0E     A  TSTVL     LDAA     DATAH       BATV-.17 VOLTS
00446A F26D D6 0F     A            LDAB     DATAH+1
00447A F26F C0 11     A            SUBB     #17
00448A F271 82 00     A            SBCA     #0
00449A F273 D0 23     A            SUBB     BATVL+1     IS (BATV-.17)>BATVL
00450A F275 92 22     A            SBCA     BATVL
00451A F277 2B 05 F27E            BMI      STILOK      B=NO
00452A F279 31                    INS                  CLEAN STACK
00453A F27A 31                    INS
00454A F27B 7E F1CA   A            JMP      BATBBN      GO TURN ON BAD LAMP
00455          F27E   A  STILOK    EQU      *
00456A F27E 7A 0000   A            DEC      LINDEL
00457A F281 26 C9 F24C            BNE      CONLP3
00458A F283 39                    RTS
00459                              TTL      DOUBLE PRECISION BINARY MULTIPLICATION
00460                              NAM      MULT
```

MULT     DOUBLE PRECISION BINARY MULTIPLICATION

```
00462                      *
00463                      *              REG-B 2ND BYTE
00464                      * DOUBLE PRECISION UNSIGNED BINARY MULTIPLICATION
00465                      *
00466                      * MULCND * MULPYR = PRODUCT (A,B,MULPYR)
00467                      * REG-A,B * REG-X
00468                      * PRODUCT = REG-A MOST SIGNIFICANT BYTE
00469                      *           REG-B   2ND BYTE
00470                      *           MULPYR  3RD BYTE
00471                      *           MULPYR+1 LEAST SIGNIFICANT BYTE
00472                      *
00473                      *
00474A F284 DF 50     A  MULT    STX    MULPYR     OSAVE MULTIPLIER
00475A F286 D7 4F     A          STAB   MULCND+1   SAVE MULTIPLICAND
00476A F288 97 4E     A          STAA   MULCND
00477A F28A CE 004E   A          LDX    #MULCND    POINT TO DATA
00478A F28D 86 16     A          LDAA   #16        NUMBER OF BITS
00479A F28F 97 48     A          STAA   CTR
00480A F291 4F                  CLRA
00481A F292 5F                  CLRB
00482A F293 66 02     A          ROR    2,X        MULPYR
00483A F295 66 03     A          ROR    3,X        MULPYR+1
00484A F297 24 04 F29D MULLP    BCC    SHIFT      B=BY 0 THIS TIME
00485A F299 EB 01     A          ADDB   1,X        MULCND+1
00486A F29B A9 00     A          ADCA   0,X        MULCND
00487A F29D 46                SHIFT   RORA                SHIFT PARTIAL PRODUCT
00488A F29E 56                        RORB
00489A F29F 66 02     A          ROR    2,X
00490A F2A1 66 03     A          ROR    3,X
00491A F2A3 7A 0048   A          DEC    CTR
00492A F2A6 26 EF F297         BNE    MULLP      B=MORE
00493A F2A8 97 4E     A          STAA   MULCND
00494A F2AA D7 4F     A          STAB   MULCND+1
00495A F2AC 39                  RTS
00496                              TTL    32 X 16 BIT UNSIGNED BINARY DIVIDE
00497                              NAM    DIVIDE
```

DIVIDE 32 X 16 BIT UNSIGNED BINARY DIVIDE

```
00499                       * 32 BIT BY 16 BIT UNSIGNED BINARY DIVIDE.
00500                       * ENTRY:   REG A,B=DIVISOR
00501                       *          REG X POINTS TO DIVIDEND=4 BYTES
00502                       * EXIT:    RESULT=16 BIT PRODUCT
00503                       *          REGX=RESULT
00504                       *
00505                       *
00506          F2AD   A DIVIDE EQU     *
00507A F2AD 37              PSHB
00508A F2AE 5F              CLRB
00509A F2AF E7 00     A     STAB     0,X          CLEAR MS BIT
00510A F2B1 D7 54     A     STAB     RESULT
00511A F2B3 D7 55     A     STAB     RESULT+1
00512A F2B5 C6 11     A     LDAB     #17
00513A F2B7 D7 48     A     STAB     CTR
00514A F2B9 33              PULB
00515A F2BA 4D              TSTA
00516A F2BB 2B 07 F2C4      BMI      LJUST        B=LEFT JUSTIFIED
00517A F2BD 7C 0048  A SHIFTL INC    CTR
00518A F2C0 58              ASLB
00519A F2C1 49              ROLA
00520A F2C2 2A F9 F2BD      BPL      SHIFTL
00521A F2C4 D7 53     A LJUST STAB   DIVSOR+1     SAVE DIVISOR
00522A F2C6 97 52     A     STAA     DIVSOR
00523A F2C8 A6 01     A DIV0 LDAA    1,X
00524A F2CA E6 02     A     LDAB     2,X
00525A F2CC D0 53     A     SUBB     DIVSOR+1
00526A F2CE 92 52     A     SBCA     DIVSOR
00527A F2D0 36              PSHA                  SAVE MOST SIGNIFICANT BYTE
00528A F2D1 A6 00     A     LDAA     0,X          LOAD LAST CARRY BIT
00529A F2D3 82 00     A     SBCA     #0           TAKE IT IN TO ACCOUNT
00530A F2D5 32              PULA                  MSB BACK
00531A F2D6 27 02 F2DA      BEQ      HOP
00532A F2D8 23 1F F2F9      BLS      TOOBIG
00533          F2DA   A HOP  EQU     *
00534A F2DA 6F 00     A     CLR      0,X          RESET MOST SIGNF. BIT
00535A F2DC E7 02     A     STAB     2,X
00536A F2DE A7 01     A     STAA     1,X
00537A F2E0 0D              SEC
00538A F2E1 79 0055  A DIV1 ROL     RESULT+1
00539A F2E4 79 0054  A      ROL     RESULT
00540A F2E7 68 04     A     ASL      4,X
00541A F2E9 69 03     A     ROL      3,X
00542A F2EB 69 02     A     ROL      2,X
00543A F2ED 69 01     A     ROL      1,X
00544A F2EF 69 00     A     ROL      0,X          SAVE MOST SIGNIFICANT BIT
00545A F2F1 7A 0048  A      DEC     CTR
00546A F2F4 26 D2 F2C8      BNE      DIV0
00547A F2F6 DE 54     A     LDX      RESULT
00548A F2F8 39              RTS
00549A F2F9 0C        TOOBIG CLC
00550A F2FA 20 E5 F2E1      BRA      DIV1
00551                       TTL      STARTER CURRENT TEST
```

RDBATV READ BATTERY VOLTAGE

```
00841                 *        SUBROUTINE RDBATV
00842                 *THIS SUBROUTINE READS BATV AND STORES THE VOLTAGE IN
00843                 *DATAH AND IN THE INDEX REGISTER IN HEXADECIMAL
00844                 *
00845                 *
00846A F468 86 01   A RDBATV LDAA  #01      SELECT
00847A F46A 7E F078 A        JMP   RDTEMP   READ TEMP,AND RETURN DIRECTLY TO CALLER
00848                        TTL   VOLTAGE REGULATOR TEST
00849                        NAM   VLTEST
```

HEXBCD HEXIDECIAML TO BCD CONVERSION

```
00965              * ENTRY: A = HI ORDER BYTE
00966              *        B = LO ORDER BYTE
00967              *        X = POINTER TO TABLE WHERE UNPACKED BCD IS TO BE STORED
00968              *
00969              * EXIT: ALL REGISERS DESTROYED
00970              *
00971      F4F1  A HEXBCD EQU    *
00972A F4F1 DF 07   A      STX   IXH       SAVE X
00973A F4F3 4D             TSTA            IS HEX NEGATIVE?
00974A F4F4 2A 09 F4FF     BPL   POSHEX    B=NO
00975A F4F6 50             NEGB            COMPLIMENT HEX
00976A F4F7 89 00   A      ADCA  #0
00977A F4F9 40             NEGA
```

HEXBCD HEXIDECIAML TO BCD CONVERSION

```
00978A F4FA 36                          PSHA                    SAVE A
00979A F4FB 86 80     A                 LDAA    #$80            FLAG NEGATIVE
00980A F4FD 20 02 F501                  BRA     CONTUE          CONTINUE
00981       F4FF A POSHEX EQU           *
00982A F4FF 36                          PSHA                    SAVE A
00983A F500 4F                          CLRA                    SET POSITIVE
00984A F501 97 0D     A CONTUE  STAA    BCDNEG          SET SIGN
00985A F503 86 04     A                 LDAA    #4              4 DIGITS
00986A F505 97 48     A                 STAA    CTR
00987A F507 CE F539   A                 LDX     #DECTAB         DECIMAL TABLE
00988A F50A 4F          NXTBCD  CLRA                    RESET BCD DIGIT
00989A F50B 97 4C     A                 STAA    BCDCTR
00990A F50D 32                          PULA                    A BACK
00991A F50E E0 01     A DECLOP  SUBB    1,X             SUBTRACT NEXT BCD UNIT
00992A F510 A2 00     A                 SBCA    0,X
00993A F512 2B 05 F519                  BMI     TOMUCH          B=TOO MUCH
00994A F514 7C 004C   A                 INC     BCDCTR          INC DIGIT
00995A F517 20 F5 F50E                  BRA     DECLOP
00996       F519 A TOMUCH EQU           *
00997A F519 EB 01     A                 ADDB    1,X             ADD BACK
00998A F51B A9 00     A                 ADCA    0,X
00999A F51D 36                          PSHA
01000A F51E 08                          INX                     POINT TO NEXT
01001A F51F 08                          INX
01002A F520 DF 49     A                 STX     IXH1            SAVE X POINTER
01003A F522 DE 07     A                 LDX     IXH             DATA TABLE BACK
01004A F524 96 4C     A                 LDAA    BCDCTR          BCD CHARACTER
01005A F526 9A 0D     A                 ORAA    BCDNEG          OR IN SIGN
01006A F528 7F 000D   A                 CLR     BCDNEG          RESET SIGN
01007A F52B A7 00     A                 STAA    0,X             SAVE DIGIT
01008A F52D 08                          INX                     POINT TO NEXT
01009A F52E DF 07     A                 STX     IXH
01010A F530 DE 49     A                 LDX     IXH1            DECTAB POINTER BACK
01011A F532 7A 0048   A                 DEC     CTR             MORE TO DO?
01012A F535 26 D3 F50A                  BNE     NXTBCD          B=YES
01013A F537 32                          PULA
01014A F538 39                          RTS                     RETURN
01015                                   *
01016       F539 A DECTAB EQU           *
01017A F539 03E8      A                 FDB     1000
01018A F53B 0064      A                 FDB     100
01019A F53D 000A      A                 FDB     10
01020A F53F 0001      A                 FDB     1
01021                                   TTL     ROLL DISPLAY DATA
01022                                   NAM     ROLDSP
```

ONLINE DISPLAY ONLINE ATOD INPUT

```
01205                           *       SUBROUTINE ONLINE
01206                           *THIS SUBROUTINE DISPLAYS ONE OF THE ANALOG INPUTS (8) AS
01207                           *DICTATED BY THE NUMBER IN LINENO. THIS INFORMATION IS
01208                           *TRANSFERRED TO ATOD THROUGH PBUT. ONLINE RUNS CON-
01209                           *TINUOUSLY UNTIL A PUSHBUTTON IS PUSHED, A STOP, OR
01210       .                   *POWER DOWN/UP. USER MAY JMP OR JSR TO THIS ROUTINE.
01211                           *DECIMAL POINT IS STORED AT DECPT. SEE DISPLA.
01212                           *
01213                           *
01214       F633 A ONLINE EQU   *
01215A F633 97 01     A                 STAA    ATODN           ATODN FOR ATOD SUBROUTINE
01216A F635 86 80     A NNN             LDAA    #$80            SET DISPLAY IN PROGRESS
01217A F637 97 33     A                 STAA    DISCTL
01218A F639 BD F6A7   A                 JSR     ATOD            GO GET DATA
01219       F63C A BSYTST EQU           *
01220A F63C 96 33     A                 LDAA    DISCTL          ATOD BUSY?
01221A F63E 2A 08 F648                  BPL     BUSY1           B=NO
01222A F640 CE 0044   A                 LDX     #DISREG
01223A F643 BD F74D   A                 JSR     DISPLA          DISPLAY DATA
01224A F646 20 F4 F63C                  BRA     BSYTST
01225       F648 A BUSY1 EQU            *
01226A F648 DE 02     A                 LDX     ATODD           TRANSFER DATA
01227A F64A DF 44     A                 STX     DISREG
01228A F64C DE 04     A                 LDX     ATODD+2
01229A F64E DF 46     A                 STX     DISREG+2
01230A F650 CE 0044   A                 LDX     #DISREG
01231A F653 86 19     A                 LDAA    #25             SET COUNTER SO THAT
01232A F655 97 00     A MMM             STAA    LINDEL
01233A F657 39                          RTS
01234                           *

01236                           *       SUBROUTINE LMPSOF
01237                           *THIS SUBROUTINE USES LAMPS TO TURN OFF ALL LAMPS
01238                           *
```

ONLINE DISPLAY ONLINE ATOD INPUT

```
01239A F658 CE F0FF  A LMPSOF LDX     #$F0FF    ALL LAMPS OFF
01240A F65B 20 D3 F630        BRA     LAMPS3
01241                         TTL     PUSH BUTTON SCAN
01242                         NAM     PBUT
```

PBUT   PUSH BUTTON SCAN

```
01244                *          PROGRAM PBUT
01245                *THIS PROGRAM READS THE STATES OF ALL THE PUSHBUTTONS AND
01246                *BRANCHES TO ONE OF EIGHT PROGRAMS IF ONE BUTTON IS HELD
01247                *DOWN FOR 20MSEC AND RELEASED FOR 20MSEC, WITH NO BOUNCE.
01248                *IT WILL BRANCH TO FAIL IF ANY OTHER COMBINATIONS ARE
01249                *TRIED.  IF NO PUSHBUTTONS ARE PUSHED IT WILL JUMP TO
01250                *DISPLA
01251                * NAM PBUT1
01252A F65D CE 0000  A PCLEAR LDX     #0000     CLEAR INDEX REGISTER
01253A F660 DF 07    A PBUT   STX     IXH       SAVE X POINTER
01254A F662 D6 80    A PBUT1  LDAB    PIA1AD    STORE PIA DATA IN ACC B
01255A F664 C4 0F    A        ANDB    #$0F      AND OFF LEFT NIBBLE
01256A F666 27 2A F692        BEQ     GOSHOW    BRANCH TO DISPLA IF NO PB PSHD
01257A F668 CE 041D  A        LDX     #$041D    LDX FOR COUNT DOWN
01258A F66B 17         SCGT1  TBA               STORE OLD PIA IN A
01259A F66C 98 80    A        EORA    PIA1AD    SUBTRACT NEW PIA OFF
01260A F66E 84 0F    A        ANDA    #$0F      AND OFF LEFT NIBBLE
01261A F670 26 F0 F662        BNE     PBUT1     BRANCH IF NOT THE SAME
01262A F672 09                DEX               COUNT OFF ONE
01263A F673 26 F6 F66B        BNE     SCGT1     BRANCH TO START CHG TST 1
01264A F675 C1 09    A        CMPB    #$9       ACCB<9
01265A F677 2A 19 F692        BPL     GOSHOW    B=BAD CODE
01266A F679 8E 007F  A        LDS     #$7F
01267A F67C CE F695  A        LDX     #PBTBL-2  STORE PBTBL ADDRESS IN X-2
01268A F67F 08         CTUP   INX               * INC X 2 FOR *
01269A F680 08                INX               * EVERY DEC OF B *
01270A F681 5A                DECB
01271A F682 26 FB F67F        BNE     CTUP      KEEP INDEXING UNTIL PB=0
01272A F684 7F 0037  A        CLR     RELKA     TURN ALL
01273A F687 4F                CLRA              RELAYS
01274A F688 BD F8D5  A        JSR     RELAY     OFF
01275A F68B 7F 0057  A        CLR     KFLASH    ENABLE DISPLAY
01276A F68E EE 00    A        LDX     0,X       ADDRESS OF TEST
01277A F690 6E 00    A        JMP     0,X       JUMP THRU PBTBL
01278A F692 DE 07    A GOSHOW LDX     IXH       RESTORE X
01279A F694 7E F74D  A        JMP     DISPLA
01280                *
01281                *
01282                *
01283A F697   F049   A PBTBL  FDB     BATEST    BATTERY TEST
01284A F699   F30A   A        FDB     VEHTST    STRTST,ALTEST,VLTEST
01285A F69B   F043   A        FDB     RETEST    RETEST BATTERY
01286A F69D   F5C1   A        FDB     VOLTST    EXTERNAL VOLTMETER
01287A F69F   F37C   A        FDB     XFLTST    EXTERNAL FIELD TEST
01288A F6A1   F5D1   A        FDB     DRNTST    BATTERY DRAIN TEST
01289A F6A3   F5FE   A        FDB     ACKTST    ALTERNATOR CIRCUIT RESISTANCE TEST
01290A F6A5   F541   A        FDB     ROLDSP    STRDRW,ALTOUT,VLTREG
01291                *
01292                *
01293                *
01294                         TTL     ANALOG TO DIGITAL CONVERTER
01295                         NAM     ATOD
```

ATOD   ANALOG TO DIGITAL CONVERTER

```
01321                *          INTERRUPT ROUTINE FOR ATOD
01322                *UPON INTERRUPT THIS PROGRAM
01323                *CIRCLES THRU THE A TO D HARDWARE
01324                *THREE TIMES;
01325                *1 SYNCHRONIZES INTERRUPT
01326                *2 GETS SIGN CORRECT
01327                *3 READS AND STORES DATA
01328                *
01329A F6C0 CE 0002  A BGINT  LDX     #ATODD    BUFFER ADDRESS
01330A F6C3 86 3F    A        LDAA    #$3F      SET UP PIA FOR CB2=DU=1
01331A F6C5 97 83    A        STAA    PIA1BC    CRB=XX11 1111
01332A F6C7 74 0034  A        LSR     ADIRQ     MOVE COUNTER OVER 1
01333A F6CA 25 0D F6D9        BCS     NOSYNC    BRA OUT FIRST 2 TIMES
01334A F6CC 96 82    A        LDAA    PIA1BD    CLEAR IRQ
01335A F6CE D6 34    A        LDAB    ADIRQ     FIRST TIME THROUGH
01336A F6D0 C5 02    A        BITB    #2
01337A F6D2 27 04 F6D8        BEQ     NOTFST    B=NOT FIRST
01338A F6D4 C6 37    A        LDAB    #$37
01339A F6D6 D7 83    A        STAB    PIA1BC
01340A F6D8 3B         NOTFST RTI
```

ATOD   ANALOG TO DIGITAL CONVERTER

```
01341A F6D9 86 34    A NOSYNC LDAA  #$34      *SET UP PIA FOR CB2=DU=0
01342                *                        AND DISABLE INTERRUPT
01343A F6DB 97 83    A        STAA  PIA1BC    *CRB=XX11 0100
01344A F6DD 86 10    A        LDAA  #$10      USE ADIRQ AS DIGIT
01345A F6DF 97 34    A        STAA  ADIRQ     *SELECT POINTER
01346A F6E1 96 82    A RDMORE LDAA  PIA1BD    READ DATA AND STORE
01347A F6E3 95 34    A        BITA  ADIRQ     IS THIS THE ONE?
01348A F6E5 27 FA F6E1        BEQ   RDMORE    IF NOT, WAIT FOR NEXT DIGIT
01349A F6E7 16                TAB             GOT IT! AND PUT IT IN ACCB ALSO
01350A F6E8 84 0F    A        ANDA  #$0F      AND OFF DIGIT SELECT
01351A F6EA C5 10    A        BITB  #$10      IS THIS MSD?
01352A F6EC 26 24 F712        BNE   ORASR     GO TO OVERRANGE ROUTINE
01353A F6EE A7 00    A STDATA STAA  0,X       STORE FINAL DATA AT X
01354A F6F0 08                INX             ADVANCE TO NEXT DIGIT
01355A F6F1 78 0034  A        ASL   ADIRQ     MOVE POINTER
01356A F6F4 24 EB F6E1        BCC   RDMORE    GO THRU IF DONE
01357A F6F6 30                TSX             STACK TO XREG
01358A F6F7 5F                CLRB
01359A F6F8 7D 0033  A IRQRET TST   DISCTL    WAS IT A QUICK RETURN
01360A F6FB 2B 12 F70F        BMI   CTLCLR    B=YES
01361A F6FD A6 00    A        LDAA  0,X       DO SEI DIRECT
01362A F6FF 8A 10    A        ORAA  #$10
01363A F701 A7 00    A        STAA  0,X
01364A F703 C6 05    A        LDAB  #5        MOVE STACK UP
01365A F705 A6 04    A MOVLOP LDAA  4,X       TO RETURN DIRECTLY
01366A F707 A7 06    A        STAA  6,X
01367A F709 09                DEX
01368A F70A 5A                DECB
01369A F70B 26 F8 F705        BNE   MOVLOP
01370A F70D 31                INS
01371A F70E 31                INS             CLEAN STACK
01372A F70F D7 33    A CTLCLR STAB  DISCTL
01373A F711 3B                RTI             GO BACK TO ATOD
01374                *
01375                *
01376                       TTL   ATOD OVER RANGE TEST
01377                       NAM   ORASR
```

ORASR   ATOD OVER RANGE TEST

```
01379                       ****************************************************
01380                       *SUBPROGRAM ORASR. ONLY USED BY ATOD(ABOVE).
01381                       *
01382                       *
01383                       *    BEFORE              AFTER (IF NOT OVERRANGE)
01384                       *    ORASR               ORASR
01385                       *
01386                       *
01387                       *    ATODD               ATODD
01388                       *
01389                       *    0000 Q3 Q2 Q1 Q0    Q2 0 0 0  0 0 0 Q3
01390                       *
01391A F712 16       ORASR  TAB             PUT ATODD INTO ACCB ALSO
01392A F713 C4 0B    A      ANDB  #$0B      LOOK AT OVERRANGE BIT ONLY
01393A F715 C1 03    A      CMPB  #$03      COMPARE OVRNG BIT AND 1K BIT
01394A F717 27 13 F72C      BEQ   FAIL      IF Q0=1 AND Q1=1 AND Q3=0, BRANCH
01395A F719 7F 004B  A      CLR   TEMPER
01396A F71C 5F              CLRB            ACCB=00
01397A F71D 85 04    A      BITA  #$04      LOOK AT SIGN BIT ONLY
01398A F71F 26 02 F723      BNE   POSY      BRANCH OUT IF POSITIVE
01399A F721 C6 80    A      LDAB  #$80      SET SIGN BIT IF NEGATIVE
01400A F723 43       POSY   COMA            FLIPOVER SINCE Q3=NOT 1K
01401A F724 84 08    A      ANDA  #$08      LOOK AT MAGNITUDE ONLY
01402A F726 47              ASRA            B2=Q3N
01403A F727 47              ASRA            B1=Q3N
01404A F728 47              ASRA            B0=Q3N
01405A F729 1B              ABA             A ACCA=ACCA+ACCB
01406A F72A 20 C2 F6EE      BRA   STDATA
```

```
01408                       ****************************************************
01409                       *.
01410                       *        SUBPROGRAM FAIL
01411                       *THIS PROGRAM DISPLAYS 1999 ON THE 3 1/2
01412                       *DIGIT DISPLAY LOCATED ON THE CONTROL PANEL.  IT JUMPS
01413                       *TO SUBROUTINE DISPLA.
01414                       *THE ROUTINE WILL FLASH THE 19.99
01415                       *AND RETURN TO THE MAIN LINE PROGRAM
01416                       *
01417        F72C  A FAIL   EQU   *
01418A F72C 96 01    A      LDAA  ATODN
01419A F72E 27 C8 F6F8      BEQ   IRQRET
01420        F730  A FAILNT EQU   *
01421A F730 CE 0109  A      LDX   #$109     LOAD 1999 FOR FAILURE
01422A F733 DF 02    A      STX   ATODD
```

ORASR ATOD OVER RANGE TEST

```
01423A F735 CE 0909  A           LDX    #$909
01424A F738 DF 04    A           STX    ATODD+2
01425A F73A CE 0002  A  FAIL1    LDX    #ATODD    POINT TO DATA
01426A F73D 86 12    A           LDAA   #$12      SET .25 SEC.
01427A F73F 97 00    A           STAA   LINDEL
01428A F741 8D 0A F74D  FALLOP   BSR    DISPLA
01429A F743 7A 0000  A           DEC    LINDEL
01430A F746 26 F9 F741           BNE    FALLOP    B=MORE
01431A F748 BD F4EB  A           JSR    WATQTR
01432A F74B 20 AB F6F8           BRA    IRQRET
01433                            TTL    3 1/2 DIGIT DISPLAY HANDLER
01434                            NAM    DISPLA
```

DISPLA 3 1/2 DIGIT DISPLAY HANDLER

```
01436                   *         SUBROUTINE DISPLA
01437                   *THIS ROUTINE DISPLAYS 3 1/2 DIGITS OF BCD WHICH ARE
01438                   *IN 4 BYTES OF MEMORY LOCATED AT THE ADDRESS STORED IN
01439                   *THE INDEX REGISTER. THE NUMBER IS DISPLAYED ON THE
01440                   *3 1/2 DIGIT SEVEN SEGMENT READOUT THROUGH PIAS #2
01441                   *AND #3. THE 4 DIGIT NUMBER IS DISPLAYED FOR A PERIOD
01442                   *OF 80 MSEC. CONTROL IS THEN RETURNED TO THE MAIN
01443                   *PROGRAM. ROUTINES WISHING TO DISPLA SHOULD BRANCH (BSR)
01444                   *TO PBUT ,SINCE PBUT BRANCHES TO DISPLA IF NO BUTTONS
01445                   *ARE PUSHED.
01446                   *
01447                   *DECIMAL POINT SELECT IS AS FOLLOWS*
01448                   *X.XXX   DECPT=$20
01449                   *XX.XX   DECPT=$40
01450                   *XXX.X   DECPT=$80
01451                   *
01452                   *
01453                   *
01454                   *
01455A F74D 8C 0000  A  DISPLA   CPX    #0       IF COMING FROM PBUT AND NO DISPLAY,
01456A F750 26 26 F778           BNE    GOTHRU   IF X=0 GO TO PBUT
01457A F752 7D 0057  A           TST    KFLASH
01458A F755 26 4E F7A5           BNE    RETAGN
01459A F757 7F 0088  A           CLR    PIA3AD   AFTER BLANKING DISPLAY
01460A F75A BD F468  A           JSR    RDBATV   READ BATTERY VOLTAGE
01461A F75D 4D                   TSTA            SEE IF MINUS
01462A F75E 2B 08 F768           BMI    LSBMIN   NEG. VOLTAGE
01463A F760 26 10 F772           BNE    BACKO    BLOCK MUST BE CONNECTED TO BATTERY
01464A F762 C1 02    A           CMPB   #2       SEE IF >2
01465A F764 2C 0C F772           BGE    BACKO    BLOCK CONNECTED TO BATTERY
01466A F766 20 04 F76C           BRA    REDAMB   <2 READ AMBIENT TEMPERATURE
01467A F768 C1 FE    A  LSBMIN   CMPB   #-2      >-2
01468A F76A 25 06 F772           BCS    BACKO    BLOCK CONNECTED TO BATTERY
01469       F76C     A  REDAMB   EQU    *
01470A F76C 4F                   CLRA            READ TEMPERATURE
01471A F76D BD F078  A           JSR    RDTEMP
01472A F770 DF 5A    A           STX    AMBMV
01473A F772 CE 0000  A  BACKO    LDX    #0       CLR X REG FOR PBUT
01474A F775 7E F660  A  BACK     JMP    PBUT
01475                   *
01476                   *
01477A F778 A6 00    A  GOTHRU   LDAA   0,X      LOAD THE MSD AT ADD(X)
01478A F77A DF 07    A           STX    IXH      STORE THE DATA ADDRESS
01479                   *
01480                   *
01481                   *GENERATE THE 7 SEGMENT NUMBER FOR MSD
01482                   *MSD=S000 000D; S=1=NEGATIVE; D=1=ONE VOLT
01483                   *
01484                   *
01485                   *                                        08= -    0000 1000
01486                   *                                        00=BLNK  0000 0000
01487                   *                                        0E= -1   0000 1110
01488                   *                                        06=  1   0000 0110
01489                   *
01490A F77C 16                   TAB             ACCA=ACCB
01491A F77D 56                   RORB            CARRY=D,   ACCB=0S00 0000
01492A F77E 49                   ROLA            CARRY=S,   ACCA=0000 00DD
01493A F77F 48                   ASLA            CARRY=0,   ACCA=0000 0DD0
01494A F780 57                   ASRB            CARRY=0,   ACCB=00S0 0000
01495A F781 57                   ASRB            CARRY=0,   ACCB=000S 0000
01496A F782 57                   ASRB            CARRY=0,   ACCB=0000 S000
01497A F783 1B                   ABA             ACCA=ACCA+ACCB =0000 SDD0
01498A F784 C6 10    A           LDAB   #$10     SET DS1=1
01499                   *
01500                   *
01501                   *LOAD PIAS AND TURN ON DIGIT SELECT
01502                   *
01503A F786 97 86    A  LDPIAS   STAA   PIA2BD   LOAD 7 SEG DATA
01504A F788 D7 2C    A           STAB   PIASTO   STORE DIGIT SELECT IN PIASTO
```

DISPLA 3 1/2 DIGIT DISPLAY HANDLER

```
01505A F78A D6 88    A          LDAB   PIA3AD    ACCB=OLD REGISTER=DDDD ????
01506A F78C C4 0F    A          ANDB   #$0F      ACCB=0000 ???? ; KEEP OLD ????
01507A F78E DA 2C    A          ORAB   PIASTO    ACCB=NNNN ???? ; NEW STUFF
01508A F790 D7 88    A          STAB   PIA3AD    DIGIT SELECT REGISTER UPDATED
01509                           *
01510                           *DO OTHER THREE DIGITS NOW
01511                           *
01512                           *
01513                           * 5MSEC DELAY ROUTINE
01514                           *
01515A F792 CE 0005  A          LDX    #00005
01516A F795 BD F8E7  A          JSR    WAITFO    WAIT 5 MSEC
01517                           *
01518                           *DISPLAY NEXT DIGIT
01519                           *
01520A F798 DE 07    A          LDX    IXH       X=ADDRESS OF BCD DATA
01521A F79A C4 F0    A          ANDB   #$F0      GET RID OF OTHER DATA
01522A F79C 58                  ASLB             ACCB = DIGIT SELECT
01523A F79D 26 07 F7A6          BNE    NEXT
01524A F79F 7F 0086  A          CLR    PIA2BD    TURN OFF ALL 7 SEGMENTS
01525A F7A2 09                  DEX
01526A F7A3 09                  DEX              PUT INDEX REGISTER BACK TO BEGINNING
01527A F7A4 09                  DEX
01528A F7A5 39       RETAGN     RTS
01529                           *
01530A F7A6 08       NEXT       INX              X=ADDRESS OF NEXT DIGIT
01531A F7A7 A6 00    A          LDAA   0,X       ACCA=BCD DIGIT
01532A F7A9 DF 07    A          STX    IXH       STORE ADDRESS OF DATA
01533                           *
01534A F7AB CE F7BF  A          LDX    #DSPLTB   PUT TABLE ADDRESS IN X
01535A F7AE 4D                  TSTA             A=0?
01536A F7AF 26 0A F7BB NXTDIG   BNE    NOTDIG    B=NO
01537A F7B1 D1 06    A          CMPB   DECPT     DECIMAL POINT HERE?
01538A F7B3 26 02 F7B7          BNE    NODEC     B=NO
01539A F7B5 86 80    A          LDAA   #$80      FLAG DECIMAL POINT
01540A F7B7 AA 00    A NODEC    ORAA   0,X       OR WITH DATA
01541A F7B9 20 CB F786          BRA    LDPIAS
01542                 F7BB A NOTDIG EQU *
01543A F7BB 08                  INX              POINT TO NEXT CODE
01544A F7BC 4A                  DECA
01545A F7BD 20 F0 F7AF          BRA    NXTDIG    CHECK A =0 YET
01546                           *
01547                           *          0  1  2  3  4  5  6  7  8  9
01548A F7BF 3F       A DSPLTB FCB   $3F,$06,$5B,$4F,$66,$6D,$7D,$07,$7F,$67
01549                           *DISPLAY TABLE TO CONVERT BCD TO 7 SEGMENT
01550                           *
01551                           *
01552                                  TTL    LAMP DISPLAY ROUTINE
01553                                  NAM    LAMPS
```

LAMPS   LAMP DISPLAY ROUTINE

```
01555                 *       SUBROUTINE LAMPS
01556                 *THIS PROGRAM DISPLAYS THE LAMP OR LAMPS AS DICTATED IN
01557                 *RAM AT LOCATIONS LMPCOL AND LMPROW.  LMPCOL INDICATES
01558                 *THE COLUMN AND LMPROW INDICATES WHICH ROW.  A LAMP OR
01559                 *LAMPS MAY BE EITHER TURNED ON OR OFF DEPENDING ON THE
01560                 *FIRST CHARACTER IN LMPCOL.  AN F TURNS THE LAMP(S) OFF
01561                 *AND A 0 TURNS IT (THEM) ON.  THE INDEX REGISTER IS STORED
01562                 *INTO LMPCOL, LMPROW RESPECTIVELY ON THE FIRST INSTRUCTION
01563                 *
01564                 *LMPROW * LMPCOL*    LAMP DESCRIPTION
01565                 *  FF        03      COLUMNS 1 AND 2, ALL ROWS ON
01566                 *  FF        00      COLUMN 3, ALL ROWS ON
01567                 *  FF        FX      ALL LAMPS OFF
01568                 *
01569                 *  01        #2      TEST IN PROGRESS
01570                 *  02        #2      STARTER DRAW TEST COMPLETE
01571                 *  04        #2      ALTERNATOR OUTPUT TEST COMPLETE
01572                 *  08        #2      VOLTAGE REGULATOR TEST COMPLETE
01573                 *  10        #2      LOW BATTERY VOLTAGE
01574                 *  20        #2      LOW ALTERNATOR CURRENT
01575                 *  40        #2      DIODE FAILURE
01576                 *  80        #2      EXTERNAL FIELD
01577                 *
01578                 *  08        #1      EXTERNAL VOLTMETER
01579                 *  10        #1      BATTERY DRAIN
01580                 *  20        #1      ALTERNATOR CIRCUIT RESISTANCE TEST
01581                 *
01582                 *  01        #0      REVERSE POLARITY
01583                 *  02        #0      LOW VOLTAGE
01584                 *  04        #0      KW TEST IN PROGRESS
01585                 *  08        #0      GOOD
01586                 *  10        #0      BAD
01587                 *  20        #0      GOOD RECHARGE
01588                 *  40        #0      RECHARGE RETEST
```

LAMPS LAMP DISPLAY ROUTINE

```
01589                       *   80       *0      TEST IN PROGRESS
01590                       *
01591                       * NOTE * DENOTES EITHER 'F' OR 'O',FOR 'OFF' OR 'ON' ...
01592                       * *1 MEANS CA2=0, CB2=1
01593                       * *2 MEANS CA2=1, CB2=0
01594                       * *0 MEANS CA2=0, CB2=0
01595                       *                                LMPCOL=X X X X  X X CA2 CB2
01596A F7C9 DF 09      A LAMPS  STX       LMPCOL   LMPCOL=AB; LMPROW=CD; X=ABCD
01597                       *
01598                       *
01599                       *ARRANGE NEW CA2,CB2 AND COMPARE WITH OLD CA2,CB2
01600                       *
01601A F7CB D6 09      A        LDAB      LMPCOL   ACCB=XXXX 00AB A=CA2,B=CB2
01602A F7CD 58                  ASLB               ACCB=XXXX 0AB0
01603A F7CE 58                  ASLB               ACCB=XXXX AB00
01604A F7CF 17                  TBA                ACCA=XXXX AB00
01605A F7D0 C4 08      A        ANDB      #$08     ACCB=0000 A000
01606A F7D2 48                  ASLA               ACCA=000A B000
01607A F7D3 84 08      A        ANDA      #$08     ACCA=0000 B000
01608A F7D5 97 0B      A        STAA      LMPST1   LMPST1=0000 B000
01609A F7D7 D7 0C      A        STAB      LMPST2   LMPST2=0000 A000
01610A F7D9 96 89      A        LDAA      PIA3AC   ACCA=XXXX DXXX
01611A F7DB 84 08      A        ANDA      #$08     ACCA=0000 D000
01612A F7DD 10                  SBA                ACCA=0000(D-A)000
01613A F7DE 27 20 F800          BEQ       SAMEA    CA2 SAME BRANCH
01614                       *
01615                       *SET UP CB2 AND ROWS
01616                       *
01617A F7E0 96 0B      A NOSAME LDAA      LMPST1   ACCA=0000 B000
01618A F7E2 8B 34      A        ADDA      #$34     ACCA=0011 B100
01619A F7E4 97 8B      A        STAA      PIA3BC   SELECT PR AND SET CB2=B
01620                       *
01621                       *TEST FOR ON OR OFF
01622                       *
01623A F7E6 96 09      A        LDAA      LMPCOL   ACCA=COL DATA
01624A F7E8 84 F0      A        ANDA      #$F0
01625A F7EA 27 03 F7EF          BEQ       TURNON   IF 0, TURN ROW DATA 'ON'
01626A F7EC 4F                  CLRA               TURN ALL OFF SINCE COLUMNS CHANGED
01627A F7ED 20 02 F7F1          BRA       TNSFRB
01628A F7EF 96 0A      A TURNON LDAA      LMPROW   ACCA=ROW DATA
01629A F7F1 43                TNSFRB COMA          INVERT FOR HARDWARE INVERTERS
01630A F7F2 97 8A      A        STAA      PIA3BD
01631                       *
01632                       *SET UP CA2
01633                       *
01634A F7F4 96 0C      A        LDAA      LMPST2   ACCA=0000 A000
01635A F7F6 D6 89      A        LDAB      PIA3AC   ACCB=PQRS TUVW
01636A F7F8 C4 C7      A        ANDB      #$C7     ACCB=PQ00 0UVW
01637A F7FA 1B                  ABA                ACCA=PQ00 AUVW
01638A F7FB 8A 30      A        ORAA      #$30     ACCA=PQ11 AUVW
01639A F7FD 97 89      A        STAA      PIA3AC   PIA3AC SET UP WITH CA2
01640A F7FF 39                  RTS
01641                       *
01642                       *CHECK OLD CB2 WITH NEW CB2
01643                       *
01644A F800 96 8B      A SAMEA  LDAA      PIA3BC   ACCA=XXXX DXXX
01645A F802 84 08      A        ANDA      #$08     ACCA=0000 D000
01646A F804 D6 0B      A        LDAB      LMPST1   ACCB=0000 B000
01647A F806 10                  SBA                ACCA=0000 (D-B)000
01648A F807 26 D7 F7E0          BNE       NOSAME
01649                       *
01650                       *CA2 AND CB2 HAVE NOT CHANGED. ADD NEW LAMPS TO OLD
01651                       *
01652A F809 96 0A      A        LDAA      LMPROW
01653A F80B D6 09      A        LDAB      LMPCOL
01654A F80D C4 F0      A        ANDB      #$F0     IF NOT '0' TURN OFF
01655A F80F 27 04 F815          BEQ       ADDIT
01656A F811 9A 8A      A        ORAA      PIA3BD   TURN OFF BITS IN LMPROW
01657A F813 20 05 F81A          BRA       PLXIT
01658A F815 D6 8A      A ADDIT  LDAB      PIA3BD   ACCB=OLD DATA
01659A F817 43                  COMA               INVERT FOR HARDWARE INVERTERS
01660A F818 94 8A      A        ANDA      PIA3BD   ACCA=(NOT OLD DATA).(NEW DATA)
01661A F81A 97 8A      A PLXIT  STAA      PIA3BD
01662A F81C 39                  RTS
01663                           TTL       BCD TO HEX CONVERSION
01664                           NAM       BCDTOH
```

BCDTOH BCD TO HEX CONVERSION

```
01666                       *    SUBROUTINE BCDTOH     THIS SUBROUTINE CHANGES THE
01667                       *DATA ADDRESSED BY THE INDEX REGISTER. THE 4 DIGIT BCD
01668                       *DATA IS CHANGED TO HEXADECIMAL AND STORED AT DATAH AND
01669                       *IN THE INDEX REGISTER.
01670                       * CALL WITH:
01671                       *    ADDRESS OF BCD CHARACTERS IN X
01672                       * RETURNS:
```

BCDTOH BCD TO HEX CONVERSION

```
01673                          *    16 BIT BINARY RESULT IN X AND DATAH
01674                          *  USES THE ALGORYTHM ((BCD4*10+BCD3)*10+BCD2)
01675                          *                    *10+BCD1
01676           F81D    A BCDTOH EQU      *
01677A F81D A6 00    A          LDAA     0,X         SAVE SIGN FOR LATER
01678A F81F 97 0D    A          STAA     BCDNEG
01679A F821 84 01    A          ANDA     #1          STRIP SIGN
01680A F823 A7 00    A          STAA     0,X
01681A F825 86 04    A          LDAA     #4          4 BCD DIGITS
01682A F827 97 48    A          STAA     CTR
01683A F829 4F                  CLRA
01684A F82A 5F                  CLRB
01685A F82B 58         BCDLOP   ASLB                 V*2
01686A F82C 49                  ROLA
01687A F82D D7 0F    A          STAB     DATAH+1     SAVE V*2
01688A F82F 97 0E    A          STAA     DATAH
01689A F831 58                  ASLB                 (V*2)*4=V*8
01690A F832 49                  ROLA
01691A F833 58                  ASLB
01692A F834 49                  ROLA
01693A F835 DB 0F    A          ADDB     DATAH+1     V*2+V*8=V*10
01694A F837 99 0E    A          ADCA     DATAH
01695A F839 EB 00    A          ADDB     0,X         ADD IN NEXT DIGIT
01696A F83B 89 00    A          ADCA     #0          PROPIGATE CARRY
01697A F83D 08                  INX                  POINT TO NEXT
01698A F83E 7A 0048  A          DEC      CTR         ONE LESS TO DO
01699A F841 26 E8 F82B          BNE      BCDLOP      B=MORE
01700A F843 7D 000D  A          TST      BCDNEG      IS IT NEGATIVE
01701A F846 2A 04 F84C          BPL      PLUS        B=NO
01702A F848 50                  NEGB                 2'S COMP THE RESULT
01703A F849 89 00    A          ADCA     #0
01704A F84B 40                  NEGA
01705            F84C A PLUS    EQU      *
01706A F84C D7 0F    A          STAB     DATAH+1
01707A F84E 97 0E    A          STAA     DATAH
01708A F850 DE 0E    A          LDX      DATAH       RESULTS
01709A F852 39                  RTS
01710                           TTL      TEMP COMPENSATED REFERENCE VOLTAGE
01711                           NAM      ERFTMP
```

ERFTMP TEMP COMPENSATED REFERENCE VOLTAGE

```
01713                          *        SUBROUTINE ERFTMP
01714                          *THIS SUBROUTINE GENERATES A TEMPERATURE COMPENSATED
01715                          *REFERENCE VOLTAGE BASED ON THE NUMBER IN THE INDEX
01716                          *REGISTER, WHICH IS THE TEMPERATURE IN HEX.  ETMPH
01717                          *CONTAINS THE VOLTAGE IN HEX AFTER EXECUTION.
01718                          *
01719                          *
01720A F853    73    A TMPTBL   FCB      $73,$7,$9B,$9,$AF,$B,$C3,$F
01721A F85B    D3    A          FCB      $D3,$15,$DD,$1A,$FB,$1D,$FA
01722                          *
01723                          *
01724           F862 A ERFTMP   EQU      *
01725A F862 CE F853  A          LDX      #TMPTBL
01726A F865 DF 11    A          STX      NCTH        PUT ADDRESS AT NCT
01727A F867 C6 07    A          LDAB     #7          INCREASE X VALUE BY 1994
01728A F869 86 CA    A          LDAA     #$CA
01729A F86B 9B 18    A          ADDA     TEMPHX+1    TEMP DATA
01730A F86D D9 17    A          ADCB     TEMPHX
01731A F86F 97 08    A          STAA     IXH+1       SAVE IT FOR THE X REG.
01732A F871 D7 07    A          STAB     IXH
01733                          *
01734A F873 C6 03    A          LDAB     #$03        LOAD B WITH 768
01735A F875 86 10    A          LDAA     #$10        LOAD A WITH 16 (TOTAL=784)
01736A F877 D7 13    A          STAB     ETMPH       MSD=768 IN STACK
01737A F879 C6 06    A          LDAB     #6          STORE FIRST SLOPE
01738A F87B D7 10    A STRT     STAB     STACK1      STORE SLOPE IN STACK
01739A F87D DE 07    A MORE     LDX      IXH         PUT TEMPERATURE BACK INTO X
01740A F87F D6 10    A          LDAB     STACK1      REINSTATE B=SLOPE
01741                          *
01742A F881 8C 0000  A SLPZ     CPX      #0
01743A F884 27 1C F8A2          BEQ      DONE        GET OUT IF X=0; ALL DONE
01744A F886 09                  DEX
01745A F887 5A                  DECB                 COUNT OFF SLOPE
01746A F888 26 F7 F881          BNE      SLPZ        KEEP DEC X UNTIL B=0
01747                          *
01748A F88A 4C                  INCA                 INCREASE VOLTS BY 10MV
01749A F88B 97 14    A          STAA     ETMPH+1     STORE VOLTAGE
01750A F88D 26 03 F892          BNE      SKIP        IF A=0,MUST ADD CARRY(256)
01751A F88F 7C 0013  A          INC      ETMPH       INCREASE VOLTS BY 256
01752A F892 DF 07    A SKIP     STX      IXH         STORE X WHILE CHANGING SLPE
01753A F894 DE 11    A          LDX      NCTH        X=NUMBER TO INDEX TABLE
01754A F896 A1 00    A          CMPA     0,X         COMPARE A (VOLTS) WITH NO IN TABLE
01755A F898 26 E3 F87D          BNE      MORE        CONTINUE AT SAME SLOPE IF
```

ERFTMP TEMP COMPENSATED REFERENCE VOLTAGE

```
01756                        *            A(VOLTS) IS LESS THAN TBL
01757A F89A 08                        INX           ADVANCE TABLE
01758A F89B E6 00    A                LDAB  0,X     PUT NEW SLOPE INTO ACC B
01759A F89D 08                        INX           BY 2
01760A F89E DF 11    A                STX   NCTH    REMEMBER NEW INDEX NUMBER
01761A F8A0 20 D9 F87B                BRA   STRT
01762                        *
01763A F8A2 DE 13    A DONE  LDX   ETMPH    PUT VOLTAGE IN X
01764A F8A4 58                        ASLB          DOUBLE WHATS LEFT
01765A F8A5 D1 10    A                CMPB  STACK1  END IF 2B IS LESS
01766A F8A7 2E 01 F8AA                BGT   QUIT    THAN ORIGINAL SLOPE
01767A F8A9 08                        INX           INCREASE VOLTS FOR ROUNDING
01768         F8AA  A QUIT   EQU   *
01769A F8AA DF 13    A                STX   ETMPH
01770                        * CURVE COMPENSATION
01771A F8AC 86 00    A                LDAA  #0      UPPER BYTE
01772A F8AE C6 19    A                LDAB  #25     LOWER BYTE
01773A F8B0 DB 14    A                ADDB  ETMPH+1
01774A F8B2 99 13    A                ADCA  ETMPH
01775A F8B4 D7 14    A                STAB  ETMPH+1
01776A F8B6 97 13    A                STAA  ETMPH
01777A F8B8 39                        RTS
01778                        TTL   BOUNCE BACK TEMPERATURE
01780                        NAM   EBBTMP
```

EBBTMP BOUNCE BACK TEMPERATURE

```
01782                 *       SUBROUTINE EBBTMP
01783                 *THIS PROGRAM GENERATES THE BOUNCE BACK VOLTAGE FOR A
01784                 *GIVEN TEMPERATURE. ZERO DEGREES EQUALS -1.600 VOLTS.
01785                 *EIGHTY DEGREES EQUALS 0.000 VOLTS.
01786                 *FORMULA:    FOR -2016<T:
01787                 *            EBB=1172 + (1/32)(T+2016)
01788                 *THIS PROGRAM TAKES THE NUMBER IN THE INDEX REGISTER,
01789                 *WHICH IS THE TEMPERATURE IN HEX, AND GENERATES EBB,
01790                 *THE BATTERY BOUNCE BACK VOLTAGE. EBB IS IN
01791                 *EBTMPH.
01792                 *
01793                 *
01794         F8B9  A EBBTMP EQU   *
01795A F8B9 86 05    A        LDAA  #5     FIVE SHIFTS TO DIVIDE BY 32
01796A F8BB 97 48    A        STAA  CTR
01797A F8BD C6 07    A        LDAB  #7     T+2016
01798A F8BF 86 E0    A        LDAA  #$E0
01799A F8C1 9B 18    A        ADDA  TEMPHX+1
01800A F8C3 D9 17    A        ADCB  TEMPHX
01801A F8C5 57           EBTLOP ASRB         DIVIDE T+2016 BY 32
01802A F8C6 46                 RORA
01803A F8C7 7A 0048 A          DEC   CTR
01804A F8CA 26 F9 F8C5         BNE   EBTLOP B=SHIFT AGAIN
01805                 * (T+2016)/32
01806A F8CC 8B 94    A         ADDA  #$94   ADD 1172
01807A F8CE C9 04    A         ADCB  #$4    EBB=1172+(T+2016)/32
01808A F8D0 D7 15    A         STAB  EBTMPH
01809A F8D2 97 16    A         STAA  EBTMPH+1
01810A F8D4 39                 RTS
01811                         TTL   RELAY LOAD HANDLER
01812                         NAM   RELAY
```

RELAY  RELAY LOAD HANDLER

```
01814                 *       SUBROUTINE RELAY
01815                 *THIS SUBROUTINE PULLS IN RELAYS K1 THRU K7 WHICH LOAD
01816                 *THE BATTERY IN 2.5 AMP STEPS.  THE NUMBER CORRESPONDING
01817                 *TO THE STATES BELOW IS READ FROM RELNUM.  THE STATE OF
01818                 *RELAY KA IS READ FROM RELKA.
01819                 *
01820                 *PA0=1  PULLS IN K1 LOAD=2.5AMPS
01821                 *PA1=1  PULLS IN K2 LOAD=5.0AMPS            7F=317.5AMPS
01822                 *PA2=1  PULLS IN K3 LOAD=10AMPS
01823                 *PA3=1  PULLS IN K4 LOAD=20AMPS
01824                 *PA4=1  PULLS IN K5 LOAD=40AMPS
01825                 *PA5=1  PULLS IN K6 LOAD=80AMPS
01826                 *PA6=1  PULLS IN K7 LOAD=160AMPS
01827                 *PA7=1  PULLS IN RELAY KT
01828                 *RELKA=$08 PULLS IN RELAY KA (CA2=1)
01829                 *RELKA=$10 PULLS IN RELAY KL (CB2=2)
01830                 *
01831                 *NAM RELAY
01832         F8D5  A RELAY  EQU   *
01833A F8D5 C6 34    A        LDAB  #$34
01834A F8D7 DA 37    A        ORAB  RELKA
01835A F8D9 D7 85    A        STAB  PIA2AC  SET KA ON OR OFF
```

RELAY RELAY LOAD HANDLER

```
01848                   *STORED IN THE INDEX REGISTER. THE NUMBER IS IN MSEC.
01849                   *
01850A F8E7 86 A6    A  WAITFO  LDAA  #166
01851A F8E9 4A          WAIT1   DECA              2 MICRO
01852A F8EA 26 FD F8E9          BNE   WAIT1       4 MICRO
01853A F8EC 09                  DEX               X=X-1 EVERY MILLISECOND
01854A F8ED 26 F8 F8E7          BNE   WAITFO      BR UNTIL X=0
01855A F8EF 39                  RTS
01856                           TTL   ENGINE SPEED CALCULATOR
01857                           NAM   SPEED
01836A F8DB D6 37    A          LDAB  RELKA
01837A F8DD 54                  LSRB
01838A F8DE CA 34    A          ORAB  #$34
01839A F8E0 D7 87    A          STAB  PIA2BC      SET KL ON OR OFF
01840A F8E2 97 36    A          STAA  RELNUM      ACCB=RELAY STATE
01841A F8E4 97 84    A          STAA  PIA2AD      PRA=RELNUM
01842A F8E6 39                  RTS

01844                   *
01845                   *
01846                   *      SUBROUTINE WAITFO
01847                   *THIS SUBROUTINE DELAYS FOR A TIME DICTATED BY THE VALUE
```

F.F.    OFFSET VOLTAGE CALCULATOR

```
02004                           TTL   OFFSET VOLTAGE CALCULATOR
02006                   *
02007                   *
02008                   *
02009                   *
02010                   *
02011                   * IF AMBIENT TEMP.-POST TEMP.>2 THEN TEL=(TBL(B) - .735(TBL(A))/.37
02012                   * OTHERWISE TEL=(TBL(B) - .59(TBL(A))/.49
02013                   * TBL(A)=AMBEINT TEMPERATURE
02014                   * TBL(B)=POST TEMPERATURE
02015                   * 1 MV. INCREMENT ON A TO D = 1/20 DEG.
02016                   * 80 DEG.=0 VOLTS OUT
02017                   *
02018                   *
02019                   *
02020                   *
02021                   *
02022A F9B5 DE 58    A  CALFF   LDX   POSTMV      GET BATTERY POST TEMP. IN MV.
02023A F9B7 DF 0E    A          STX   DATAH
02024A F9B9 BD FA7B  A          JSR   INIT
02025A F9BC DF 5C    A          STX   POSTTM      STORE TEMPERATURE IN HEX
02026A F9BE DE 5A    A          LDX   AMBMV       GET AMBIENT TEMPERATURE IN MV.
02027A F9C0 DF 0E    A          STX   DATAH
02028A F9C2 BD FA7B  A          JSR   INIT
02029A F9C5 DF 5E    A          STX   AMBTM       STORE ACTUAL TEMP IN HEX DEG.
02030                   * CHECK FOR (AMB. TEMP-POST TEMP.) <= 2
02031A F9C7 D6 5F    A          LDAB  AMBTM+1
02032A F9C9 96 5E    A          LDAA  AMBTM
02033A F9CB D0 5D    A          SUBB  POSTTM+1    SUB. BLOCK TEMP. ON BAT.
02034A F9CD 92 5C    A          SBCA  POSTTM
02035A F9CF 26 0A F9DB          BNE   CHKMOR
02036A F9D1 C1 01    A          CMPB  #1          IS TEMP GREATER THAN +1 ?
02037A F9D3 23 19 F9EE          BLS   TELECN      BR HERE IF YES
02038                   *
02039                   * CHECK FOR AMB.TEMP-POST TEMP>1<=4
02040                   *
02041A F9D5 C1 04    A          CMPB  #4
02042A F9D7 23 26 F9FF          BLS   TELECI
02043A F9D9 20 02 F9DD          BRA   TELECY      BR HERE IF NO
02044A F9DB 2B 11 F9EE CHKMOR   BMI   TELECN
02045A F9DD 96 5E    A  TELECY  LDAA  AMBTM
02046A F9DF D6 5F    A          LDAB  AMBTM+1
02047A F9E1 CE C800  A          LDX   #$C800      MULT TEMP BY .735
02048A F9E4 BD F284  A          JSR   MULT
02049A F9E7 8D 27 FA10          BSR   SETPT
02050A F9E9 CE 02B3  A          LDX   #$2B3       EQUAL TO DIV. BY .37
02051A F9EC 20 34 FA22          BRA   GUDVAL
02052A F9EE 96 5E    A  TELECN  LDAA  AMBTM
02053A F9F0 D6 5F    A          LDAB  AMBTM+1
02054A F9F2 CE 8800  A          LDX   #$8800      MULT BY .53
02055A F9F5 BD F284  A          JSR   MULT
02056A F9F8 8D 16 FA10          BSR   SETPT
02057A F9FA CE 020A  A          LDX   #$20A       EQUIV. TO DIV. BY .4904
02058A F9FD 20 23 FA22          BRA   GUDVAL
02059A F9FF 96 5E    A  TELECI  LDAA  AMBTM
02060A FA01 D6 5F    A          LDAB  AMBTM+1
02061A FA03 CE A400  A          LDX   #$A400      MULT BY .6406
02062A FA06 BD F284  A          JSR   MULT
02063A FA09 8D 05 FA10          BSR   SETPT
02064A FA0B CE 0246  A          LDX   #$246
```

F.F.  OFFSET VOLTAGE CALCULATOR

```
02065A FA0E 20 12 FA22            BRA     GUDVAL
02066A FA10 EE 01    A SETPT      LDX     1,X         GET TEMP IN X REG
02067A FA12 DF 60    A            STX     NEWTMP      AND STORE IT
02068A FA14 5F                    CLRB                SUBTRACT NEWTMP FROM POSTTM
02069A FA15 96 5D    A            LDAA    POSTTM+1
02070A FA17 D0 61    A            SUBB    NEWTMP+1
02071A FA19 92 60    A            SBCA    NEWTMP
02072A FA1B 2A 04 FA21            BPL     OKSIGN      BR IF POS.
02073A FA1D 50                    NEGB
02074A FA1E 89 00    A            ADCA    #0
02075A FA20 40                    NEGA
02076           FA21 A OKSIGN     EQU     *
02077A FA21 39                    RTS
02078A FA22 BD F284  A GUDVAL     JSR     MULT
02079A FA25 17                    TBA                 A=B
02080A FA26 E6 02    A            LDAB    2,X
02081A FA28 36                    PSHA
02082A FA29 37                    PSHB
02083A FA2A D6 88    A            LDAB    PIA3AD
02084A FA2C C5 08    A            BITB    #$8
02085A FA2E 27 20 FA50            BEQ     ALDNE
02086A FA30 CE 01F4  A            LDX     #500
02087A FA33 DF 1E    A            STX     SPDPER
02088A FA35 16                    TAB
02089A FA36 4F                    CLRA
02090A FA37 CE 0044  A            LDX     #DISREG
02091A FA3A BD F4F1  A            JSR     HEXBCD
02092A FA3D 86 00    A            LDAA    #$0
02093A FA3F 97 06    A            STAA    DECPT
02094A FA41 CE 0044  A LP1        LDX     #DISREG
02095A FA44 BD F74D  A            JSR     DISPLA
02096A FA47 DE 1E    A            LDX     SPDPER
02097A FA49 09                    DEX
02098A FA4A 27 04 FA50            BEQ     ALDNE
02099A FA4C DF 1E    A            STX     SPDPER
02100A FA4E 20 F1 FA41            BRA     LP1
02101A FA50 33         ALDNE      PULB
02102A FA51 32                    PULA
02103A FA52 80 50    A OKSGN      SUBA    #80
02104A FA54 2A 0C FA62            BPL     OKNOW       SEE IF PLUS
02105A FA56 37                    PSHB
02106A FA57 C6 FF    A            LDAB    #$FF        SET NEG BIT
02107A FA59 D7 64    A            STAB    SETNEG
02108A FA5B 33                    PULB
02109A FA5C 50                    NEGB
02110A FA5D 89 00    A            ADCA    #0
02111A FA5F 40                    NEGA
02112A FA60 20 03 FA65            BRA     OKNOW1
02113A FA62 7F 0064  A OKNOW      CLR     SETNEG
02114A FA65 CE 1400  A OKNOW1     LDX     #$1400
02115A FA68 BD F284  A            JSR     MULT
02116A FA6B 7D 0064  A DUN        TST     SETNEG
02117A FA6E 2A 04 FA74            BPL     ALLDUN
02118A FA70 50                    NEGB
02119A FA71 89 00    A            ADCA    #0
02120A FA73 40                    NEGA
02121A FA74 97 54    A ALLDUN     STAA    RESULT
02122A FA76 D7 55    A            STAB    RESULT+1
02123A FA78 DE 54    A            LDX     RESULT
02124A FA7A 39                    RTS
02125                             *
02126                             *
02127                             *
02128                             *
02129           FA7B A INIT       EQU     *
02130A FA7B D6 0F    A            LDAB    DATAH+1     POST TEMP LSB
02131A FA7D 96 0E    A            LDAA    DATAH       MSB
02132A FA7F 2A 04 FA85            BPL     SIGNOK      BR. IF TEMP ABOVE 80 DEG.
02133A FA81 50                    NEGB                NORMALIZE TEMP
02134A FA82 89 00    A            ADCA    #0
02135A FA84 40                    NEGA
02136A FA85 97 4E    A SIGNOK     STAA    DIVEND+1    00XX.XX00
02137A FA87 D7 4F    A            STAB    DIVEND+2
02138A FA89 5F                    CLRB
02139A FA8A D7 51    A            STAB    DIVEND+4
02140A FA8C D7 50    A            STAB    DIVEND+3
02141A FA8E CE 004D  A            LDX     #DIVEND
02142A FA91 86 14    A            LDAA    #20         MV/20+80=POST TEMP
02143A FA93 BD F2AD  A            JSR     DIVIDE
02144A FA96 5F                    CLRB                ADD 80 DEG
02145A FA97 86 50    A            LDAA    #80
02146A FA99 7D 000E  A            TST     DATAH       SEE IF ABOVE OR BELOW 80 DEG
02147A FA9C 2A 0A FAA8            BPL     PLUSD       BR IF ABOVE
02148A FA9E D0 55    A            SUBB    RESULT+1
02149A FAA0 92 54    A            SBCA    RESULT
02150A FAA2 5D         TSTRND     TSTB
02151A FAA3 2B 0B FAB0            BMI     NORND
```

F.F. OFFSET VOLTAGE CALCULATOR

```
02152A FAA5 4A                  DECA
02153A FAA6 20 08 FAB0          BRA     NORND
02154       FAA8 A    PLUSD     EQU     *
02155A FAA8 DB 55  A            ADDB    RESULT+1
02156A FAAA 99 54  A            ADCA    RESULT
02157A FAAC 5D                  TSTB
02158A FAAD 2A 01 FAB0          BPL     NORND
02159A FAAF 4C                  INCA
02160A FAB0 97 55  A    NORND   STAA    RESULT+1
02161A FAB2 4F                  CLRA
02162A FAB3 97 54  A            STAA    RESULT
02163A FAB5 DE 54  A            LDX     RESULT
02164A FAB7 39                  RTS
02165                           NAM
02166                           TTL     GLOBE UNION BATTERY TESTER
02167                    *
02168                    * INTERRUPT VECTORS
02169                    *
02170A FFF8                     ORG     $FFF8
02171                    *
02172A FFF8 F6C0  A             FDB     BGINT    INTERRUPT REQUEST VECTOR
02173A FFFA F000  A             FDB     RESTAR   NOT USED (SWI)
02174A FFFC F000  A             FDB     RESTAR   NOT USED (NMI)
02175A FFFE F000  A             FDB     RESTAR   RESTART VECTOR
02176                           END
TOTAL ERRORS 00000
```

GLOBE UNION BATTERY TESTER

```
ACDISP F617   ACDONE F628   ACKTST F5FE   ACNODS 0021
ALTEST F393   ALTOUT 003C   AMBHV  005A   AMBTM  005E
BACKO  F772   BADBAT F087   BADDOD F98A   BADSPD F4D9
BATEST F049   BATLSB F1A7   BATLUP F108   BATVA  0026
BCDLOF F82B   BCDNEG 000D   BCDNOW F081   BCDTOH F81D
BRDBAT F055   BRLDOA F140   BSTART F04C   BSYTST F63C
BTMCLR F06F   BTFNEG F064   BUSY1  F648   CALFF  F985
CONLP1 F21B   CONLP2 F255   CONLP3 F24C   CONTDR F12A
CTUF   F67F   DATAH  000E   DECLOP F50E   DECPT  0006
DISFA  F619   DISFLA F74D   DISREG 0044   DIVO   F2C8
DLYST  F0BE   DLYTIM 0056   DONE   F8A2   DRLOOP F11E
DRWON  F323   DSFLTB F7BF   DUN    FA6B   EBBTMP FBB9
ETMFH  0013   FAIL   F72C   FAIL1  F73A   FAILNT F730
FLSH   F97D   FLSHM1 F450   FLSHUM F447   FRAILG F41E
GUDVAL FA22   HEXBCD F4F1   HOF    F2DA   INIT   FA7B
LAMFS  F7C9   LAMFS0 F1D1   LAMFS1 F379   LAMFS2 F465
LINE01 F5E5   LINE1  F5F0   LINE2  F5F2   LJUST  F2C4
LMFST2 000C   LP1    FA41   LPONOF F23E   LSBMIN F768
MOVLOF F705   MULCND 004E   MULLP  F297   MULPYR 0050
NEWTMP 0060   NEXT   F7A6   NNN    F635   NODEC  F7B7
NOTDIG F7BB   NOTFST F6D8   NXTBCD F50A   NXTDIG F7AF
ONSIGN FA21   ONLINE F633   ORASR  F712   PBTBL  F697
PIA1AD 0080   PIA1BC 0083   PIA1BD 0082   PIA2AC 0085
PIA3AD 0088   PIA3BC 008B   PIA3BD 008A   PIASTO 002C
POSTMV 0058   POSTTM 005C   POSY   F723   QUIT   F8AA
RDMORE F6E1   RDSALT F55F   RDSPLA F56A   RDSREG F58A
REGCTR 0032   RELAY  F8D5   RELAY1 F423   RELKA  0037
RETAGN F7A5   RETEST F043   RETURN F6BF   RFLASH F398
ROLDSP F541   ROUT   F59E   RPBUT  F56D   RPLOK  F3B4
RSPEED F3B7   SAMEA  F800   SCGT1  F66B   SETNEG 0064
SKIP   F892   SLPZ   F881   SPD15H F4CB   SPD20H F4DB
SPDPER 001E   SPDRED F933   SPDST  F91D   SPDSTO 001B
SSENS  F8FF   SSG0   F94E   SSKIP  F94A   STACK1 0010
STRLOF F362   STRT   F87B   STTMP  F0DB   TELECI F9FF
TMFAGN F0C2   TMPTBL F853   TNSFRB F7F1   TOMUCH F519
TSTVL  F26B   TURNON F7EF   VALUE  0062   VCTR10 002A
VFLASH F315   VHF15S F33C   VHFSEC F32C   VLTEST F46D
VSPD2  F496   VSPEED F47F   WAIT1  FBE9   WAIT2  F6BB
XFRDI  F3EB   XQUIT  F426   XSPEED F430   XX1    F575
ADDIT  F815   ADIRQ  0034   ALONE  FA50   ALLDUN FA74
ATOD   F6A7   ATODD  0002   ATODN  0001   BACK   F775
BATBBN F1CA   BATCLR F08A   BATCON F1D4   BATCTR 002D
BATVL  0022   BATVTC 0024   BATXX  F14B   BCDCTR 004C
BCNSTR 002E   BEZAB  F139   BGINT  F6C0   BLINK  F09C
BTDISP F115   BTDONE F15A   BTGOOD F150   BTLTOF F155
CCSH   0028   CHARLI F153   CHNMOR F9DB   CLRGST F06C
CONTST F24A   CONTUE F501   CTLCLR F70F   CTR    0048
DECTAB F539   DISBTV F163   DISBVO F16F   DISCTL 0033
DIV1   F2E1   DIVEND 004D   DIVIDE F2AD   DIVSOR 0052
DRNLOP F17A   DRNLP1 F196   DRNTST F5D1   DRWLMP F564
EBLOOP F1BD   EBTLOP FBC5   EBTMFH 0015   ERFTMF F862
FALLOP F741   FLHLHT F9BB   FLHVFA F9AB   FLHVFT F998
FSHFST 0065   GOSHOW F692   GOTHRU F778   GRECRG F23B
IRQRET F6F8   IXH    0007   IXH1   0049   KFLASH 0057
LAMPS3 F630   LDPIAS F786   LINDEL 0000   LINE0  F5E2
LMPCOL 0009   LMPROW 000A   LMPSOF F658   LMPST1 000B
LSBTST F0B7   LWVLTS F354   MMM    F655   MORE   F87D
MULT   F284   NBUSY2 F1BE   NCTH   0011   NCTL   0012
```

| | | | | | | | | | |
|---|---|---|---|---|---|---|---|---|---|
| NODIS1 | F12D | NORND | FAB0 | NOSAME | F7E0 | NOSYNC | F6D9 | | |
| OK1500 | F3C0 | OKNOW | FA62 | OKNOW1 | FA65 | OKSGN | FA52 | | |
| PBUT | F660 | PBUT1 | F662 | PCLEAR | F65D | PIA1AC | 0081 | | |
| PIA2AD | 0084 | PIA2BC | 0087 | PIA2BD | 0086 | PIA3AC | 0089 | | |
| PLUS | F84C | PLUSD | FAA8 | PLXIT | F81A | POSHEX | F4FF | | |
| RACUM | F5B2 | RAGAIN | F585 | RCHK | F5AF | RDBATV | F468 | | |
| RDSSDR | F558 | RDTEMP | F078 | RDVIDE | F3C7 | REDAMB | F76C | | |
| RELNUM | 0036 | RESTAR | F000 | RESULT | 0054 | RET1 | F077 | | |
| RIPPLE | F964 | RIPSTA | 0020 | RNEXT | F54B | ROLCNT | 0035 | | |
| RRELAY | F3DD | RSBRCT | F3C3 | RSHIFT | F3CA | RSPEE1 | F3A0 | | |
| SETPT | FA10 | SHIFT | F29D | SHIFTL | F2BD | SIGNOK | FA85 | | |
| SPDCHK | F972 | SPDFLP | 001C | SPDLOW | F95F | SPDONE | 0019 | | |
| SPDTRU | 001D | SPDXX | F938 | SPDZRO | 001A | SPEED | F8F0 | | |
| STDATA | F6EE | STILOK | F27E | STOVER | F0BB | STRDRW | 0038 | | |
| TELECN | F9EE | TELECY | F9DD | TEMPER | 004B | TEMPHX | 0017 | | |
| TOOBIG | F2F9 | TSTDOD | F981 | TSTOFF | F41B | TSTRND | FAA2 | | |
| VEHCTR | 002F | VEHDVD | 0030 | VEHTST | F30A | VERD50 | F2FC | | |
| VLTREG | 0040 | VLVJMP | F359 | VOLTST | F5C1 | VRGLOP | F4B5 | | |
| WAITFO | F8E7 | WATQTR | F4ED | XFIELD | 0031 | XFLTST | F37C | | |

It will thus be seen that a completely automatic battery temperature measuring circuit has been provided which requires no activities to be performed by the user as well as a battery analyzing apparatus making use of the battery temperature measuring circuit. The battery temperature measuring circuit is effective to measure the temperature of a connector attached to the battery post at a time just prior to attachment of the connector to the battery under test and at the end of a time period following attachment of the connector to the battery under test. Thus, the measured temperature is relatively uneffected by such things as the heat of the operator's hand which might tend to warm the battery connector as the operator secured the connector to the battery post. It has been found in practice that the battery temperature measuring circuit of this invention gives considerably greater accuracy than apparatus of the prior art which, for instance, attempted to measure the temperature of the battery post rather than the temperature of the battery connector and utilized the temperature of the battery post at a time immediately following attachment of the connector to the battery post thus completely ignoring any information available concerning the ambient temperature. Further, the temperature measuring apparatus disclosed requires no access whatsoever to the interior of the battery under test and may make use of a battery connector which is relatively small and may be used with a wide variety of battery types. Finally, the temperature measuring apparatus does not require an excessively long time to determine the battery temperature. There has further been provided a battery analyzing apparatus including such a temperature measuring circuit which is effective to alter the tests performed on the battery in response to the battery temperature.

While a particular embodiment of this invention has been described, it will be understood, of course, that the invention is not to be limited thereto since modification may be made by those skilled in the art, particularly in light of the foregoing teachings. As an example, the second measurement of the connector block temperature might be made at the end of the fixed time period following attachment of the battery testing apparatus to the battery under test rather than at the end of a fixed time period following initiation of the battery test procedure by the operator. As a further example, the second measurement of the connector block temperature might be at the end of a time period of variable length so that, for example, the period required to measure the battery temperature could be considerably shortened where the battery temperature is relatively close to the ambient temperature. As a still further example, the ambient temperature could be measured using a second temperature sensor placed at a physical location other than the connector block so that any effect of handling of the connector block by the operator on the determined battery temperature could be further reduced. And as a last example, since the determined battery temperature is only used to determine the magnitude of other reference voltages for use by the battery analyzer, it is also possible that the intermediate step of determining the battery temperature could be eliminated and the reference voltages determined directly from the measured ambient and connector block temperatures. It is contemplated by the appended claim to cover any such modifications as full within the true spirit and scope of this invention:

We claim:

1. An automatic battery analyzer including apparatus for compensating for the electrolyte temperature of the battery under test and comprising:
   connector means for attachment to the battery under test;
   temperature sensing means in association with said connector means and producing an output signal in response to the sensed temperature; and
   means coupled to said connector means and said temperature sensing means for performing electrical tests on the battery under test and altering the tests performed in response to the value of said temperature sensing means output signal at a time prior to attachment of said connector means to the battery under test and at a time after attachment of said connector means to said battery under test.

2. An automatic battery analyzer including apparatus for compensating for the electrolyte temperature of the battery under test and comprising:
   connector means for attachment to the battery under test;
   temperature sensing means in thermal contact with said connector means for developing an output signal responsive to the temperature of said connector means; and
   means coupled to said connector means and said temperature sensing means for performing electrical tests on the battery under test and altering the tests performed in response to the value of said temperature sensing means output signal at a plurality of times.

3. An automatic battery analyzer including apparatus for compensating for the electrolyte temperature of the battery under test and comprising:
   connector means for attachment to the storage battery under test;
   temperature sensing means in thermal contact with said connector means for developing an output signal responsive to the temperature of said connector means; and
   means coupled to said connector means and said temperature sensing means for performing electrical tests on the battery under test and altering the tests performed in response to the value of said temperature sensing means output signal at a time prior to attachment of said connector means to the battery under test and at a time after attachment of said connector means to said battery under test.

4. An automatic battery analyzer including apparatus for compensating for the electrolyte temperature of the battery under test and comprising:
   a connector block for attachment to a terminal of the battery under test;
   a temperature sensing element located within and in thermal contact with said temperature sensing element and producing an output signal in response to the temperature of said connector block;
   means coupled to said connector block and said temperature sensing element for performing electrical tests on the battery under test and altering the tests performed in response to the value of said temperature sensing element output signal at a first time prior to attachment of said connector block to the battery under test and at a second time after attachment of said connector block to the battery under test.

5. The automatic battery analyzer of claim 4 wherein said connector block has a thermal time constant in the range of approximately 25 to 35 seconds.

6. The automatic battery analyzer of claim 4 wherein said connector block has a thermal time constant of approximately 30 seconds.

7. The automatic battery analyzer of claim 6 wherein said connector block is brass.

8. Apparatus for determining the electrolyte temperature of a storage battery and comprising:
   connector means for attachment to the battery under test;
   temperature sensing means producing output signals in response to the ambient temperature and to the temperature of said connector means at a time after attachment of said connector means to said battery under test; and
   means coupled to said temperature sensing means for developing a signal representative of said storage battery electrolyte temperature in response to said output signals responsive to the ambient temperature and the temperature of said connector means at a time after attachment of said connector means to said battery under test.

9. An automatic battery analyzer including apparatus for compensating for the electrolyte temperature of the battery under test and comprising:
   connector means for attachment to the battery under test;
   temperature sensing means having at least a portion thereof in association with said connector means producing output signals in response to the ambient temperature and to the temperature of said connector means at a time after attachment of said connector means to said battery under test; and
   means coupled to said connector means and said temperature sensing means for performing electrical tests on the battery under test and altering the tests performed in response to the value of said temperature sensing means output signals responsive to ambient temperature and to the temperature of said connector means at a time after attachment of said connector means to said battery under test.

10. An automatic battery analyzer including apparatus for compensating for the electrolyte temperature of the battery under test and comprising:
    connector means for attachment to the battery under test;
    temperature sensing means having at least a portion thereof in thermal contact with said connector means for developing output signals responsive to the ambient temperature and to the temperature of said connector means at a time after attachment of said connector means to said battery under test; and
    means coupled to said connector means and said temperature sensing means for performing electrical tests on the battery under test and altering the tests performed in response to the output signals responsive to the ambient temperature and the temperature of said connector means at a time after attachment of said connector means to said battery under test.

11. The automatic battery analyzer of claim 10 wherein said connector means comprises a block having a thermal time constant in the range of approximately 25 to 35 seconds.

12. The automatic battery analyzer of claim 10 wherein said connector means comprises a block having a thermal time constant of approximately 30 seconds.

13. The automatic battery analyzer of claim 12 wherein said connector block is brass.

* * * * *

UNITED STATES PATENT AND TRADEMARK OFFICE
CERTIFICATE OF CORRECTION

PATENT NO. : 4,342,963

DATED : August 3, 1982

INVENTOR(S) : Gary A. Karnowski and Durvasula V. Sriramamurty

It is certified that error appears in the above-identified patent and that said Letters Patent are hereby corrected as shown below:

Col. 1, lines 51-52, delete "temperatures" and insert therefor
-- temperature --;

Col. 1, line 68, delete "now Pat. No. 4,193,025";

Col. 5, line 13, delete "member" and insert therefor
-- memory --;

Cols. 43-44, delete the material bearing program line numbers 01836A-01847 from its present position and insert it at the top of the page;

UNITED STATES PATENT AND TRADEMARK OFFICE
CERTIFICATE OF CORRECTION

PATENT NO. : 4,342,963

Page 2 of 2

DATED : August 3, 1982

INVENTOR(S) : Gary A. Karnowski and Durvasula V. Sriramamurty

It is certified that error appears in the above-identified patent and that said Letters Patent are hereby corrected as shown below:

Cols. 29-30, after program line number 01295, insert the following material:

```
                      ATOD    ANALOG TO DIGITAL CONVERTER

01297                          *        SUBROUTINE ATOD
01298                          *THIS ROUTINE READS DATA FROM PIA1BD AND STORES IT IN RAM
01299                          *AT ATODU WHICH IS THE MSD. ATODN DICTATES WHICH LINE TO
01300                          *SENSE (OTO7). ADDRESS OF MSD REMAINS IN THE INDEX REGISTER
01301                          *FIA DATA DIRECTION REGISTERS MUST BE PRESET
01302                          *BEFORE THIS PROGRAM.  SEE PBUT
01303                          *
01304                          *
01305           F6A7   A ATOD   EQU    *
01306A F6A7 96 01      A        LDAA   ATODN    STORE LINE NUMBER IN ACCA
01307A F6A9 97 BB      A        STAA   PIA3AD   PIA3 PR=LINE #(007007)
01308A F6AB C6 04      A        LDAB   #$04
01309A F6AD D7 34      A        STAB   ADIRD    USE ADIRD AS COUNTER(0100)
01310A F6AF D6 B2      A        LDAB   PIA1BD   READ PIA TO CLEAR INTRPT
01311A F6B1 C6 37      A        LDAB   #$37     SET UP PIA FOR CB2=DU=01 AND
01312A F6B3 0E                  CLI                 FOR CB1 TO BE SENSING INTERRUPT
01313A F6B4 D7 B3      A        STAB   PIA1BC   CRB=XX11 0111
01314A F6B6 7D 0033    A        TST    DISCTL
01315A F6B9 2B 04 F6BF          BMI    RETURN   $=DISPLAY IN PROGRESS
01316A F6BB 01              WAIT2 NOP
01317A F6BC 3E                  WAI             WAIT FOR INTERRUPT #1
01318A F6BD 20 FC F6BB          BRA    WAIT2
01319A F6BF 39              RETURN RTS          GO BACK TO MAIN
```

*Signed and Sealed this*

Fourteenth  *Day of* June 1983

[SEAL]

Attest:

DONALD J. QUIGG

*Attesting Officer*    *Acting Commissioner of Patents and Trademarks*